US008601414B2

(12) United States Patent
Andraus et al.

(10) Patent No.: US 8,601,414 B2
(45) Date of Patent: Dec. 3, 2013

(54) AUTOMATED SCALABLE VERIFICATION FOR HARDWARE DESIGNS AT THE REGISTER TRANSFER LEVEL

(75) Inventors: Zaher Andraus, Ann Arbor, MI (US); Karem A. Sakallah, Ann Arbor, MI (US); Mark Liffiton, Bloomington, IL (US)

(73) Assignee: The Regents of The University of Michigan, Ann Arbor, MI (US)

( * ) Notice: Subject to any disclaimer, the term of this patent is extended or adjusted under 35 U.S.C. 154(b) by 470 days.

(21) Appl. No.: 12/945,020

(22) Filed: Nov. 12, 2010

(65) Prior Publication Data

US 2013/0145328 A1 Jun. 6, 2013

Related U.S. Application Data

(60) Provisional application No. 61/260,445, filed on Nov. 12, 2009.

(51) Int. Cl.
*G06F 9/455* (2006.01)
*G06F 17/50* (2006.01)

(52) U.S. Cl.
USPC ........... 716/106; 716/102; 716/103; 716/107; 703/13; 703/14; 703/15; 703/2; 703/4

(58) Field of Classification Search
USPC .................... 716/102, 103, 106, 107
See application file for complete search history.

(56) References Cited

U.S. PATENT DOCUMENTS

| 6,728,939 | B2 * | 4/2004 | Johannsen ................ 716/103 |
| 6,975,976 | B1 * | 12/2005 | Casavant et al. ............. 703/14 |
| 7,406,405 | B2 * | 7/2008 | McMillan et al. ............. 703/2 |
| 7,742,907 | B2 * | 6/2010 | Gupta et al. ................. 703/14 |
| 8,122,401 | B1 * | 2/2012 | Chauhan et al. ............ 716/107 |
| 8,131,661 | B2 * | 3/2012 | Ganai ........................ 706/46 |

OTHER PUBLICATIONS

Z. Andraus et al "Automatic Abstraction and Verification of Verilog Models", *Proc. DAC*, pp. 218-223, Jun. 2004.

Z. Andraus et al "Refinement Strategies for Verification Methods Based on Datapath Abstraction", *Proc. ASPDAC*, pp. 19-24 Jan. 2006.

* cited by examiner

*Primary Examiner* — Nha Nguyen
*Assistant Examiner* — Brian Ngo
(74) *Attorney, Agent, or Firm* — Harness, Dickey & Pierce, P.L.C.

(57) ABSTRACT

A system and methods are provided for verifying a hardware design for an electronic circuit. The method may include: providing a hardware design description for the electronic circuit; extracting a set of design constraints from the hardware design description, where the set of design constraints represents the electronic circuit in terms of signals and logical operations performed on the signals; creating an abstraction model from the set of design constraints, where the abstraction model abstracts one or more of the logical operations in the set of design constraints by replacing the abstracted logical operations with uninterpreted functions; and property checking the abstraction model in relation to one or more design properties. When a violation in the electronic circuit is detected by the property checking step, the feasibility of the violation is then checked and, if the violation is deemed infeasible, the abstraction model is refined.

20 Claims, 8 Drawing Sheets

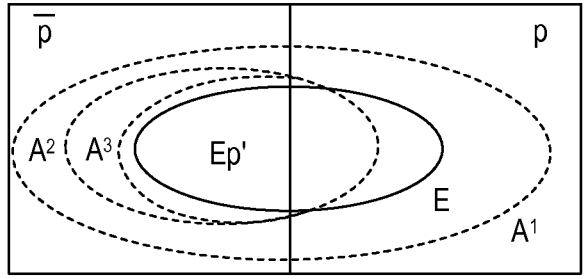
Any $A$ such that $Ep' \rightarrow A$ is a sound approximation of $E$
Fig. 1A
Fig. 1B
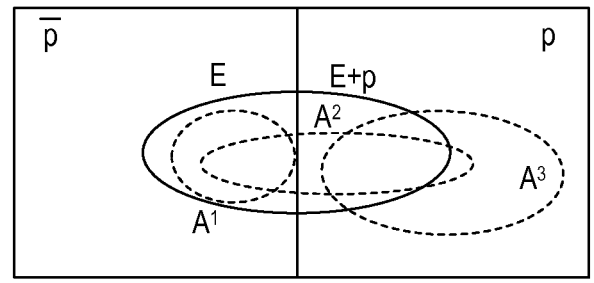
Any $A$ such that $A \rightarrow E + p$ is a complete approximation of $E$
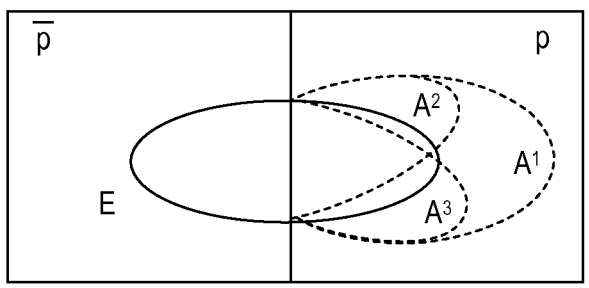
Sound and complete approximations of $E$ must satisfy $A \in [Ep', E+p]$
Fig. 1C

Iterative

Iterative Sound

AUTOMATED SCALABLE VERIFICATION FOR HARDWARE DESIGNS AT THE REGISTER TRANSFER LEVEL

CROSS-REFERENCE TO RELATED APPLICATIONS

This application claims the benefit of U.S. Provisional Application No. 61/260,445, filed on Nov. 12, 2009. The entire disclosure of this application is incorporated herein by reference.

GOVERNMENT INTEREST

This invention was made with government support under IIS0705103 awarded by the National Science Foundation and HR0011-04-3-0002 awarded by the Defense Advanced Research Projects Agency. The government has certain rights in the invention.

FIELD

The present disclosure relates to formal verification of complex hardware designs.

BACKGROUND

Automating and scaling pre-silicon functional verification of state-of-the-art hardware designs, such as microprocessors and microcontrollers, presents many challenges. These designs employ wide datapaths with arithmetic, logical, and memory units, and complex control logic that coordinates their functionality. The latter typically includes a set of high-level optimizations aimed at increasing a design's throughput, and reducing its area and power consumption. The complexity of both the datapath and control logic results in an enormous state space with vast room for design errors. Furthermore, the progression in the design of hardware systems like microprocessors leads to ever-increasing control logic complexity, and overall chip size, as predicted by Moore's law.

In contrast to simulation, which typically examines a (relatively) small number of scenarios when testing a design, formal verification systematically proves correctness of a design by exhaustively examining the entire design's state space searching for violations to a well-specified behavior. The size of the state space grows exponentially with the size of the design, leading to the so-called state explosion problem. Since the control logic and datapath of contemporary designs are also growing exponentially (in both size and complexity), the formal verification 'barrier' grows doubly exponentially, and significantly lags behind the design capability, leading to an exponentially growing verification gap. The increase in complexity and size of today's designs, as well as the difficulty of formally verifying these designs.

Verification thus, cannot be made tractable without a divide-and-conquer approach that tailors different verification methodologies to various parts of the design with different structural patterns. To be effective, these methodologies must be applied at suitable levels of abstraction. In particular, descriptions given at the Register-Transfer Level (RTL) accurately capture the functionality of hardware designs by preserving high-level semantic information that is otherwise lost when moving to the gate- or transistor-level representations. It is, therefore, reasonable to assume that the design under verification be given as an RTL model in a suitable Hardware Description Language (HDL) such as Verilog.

At this level, a reasonable distinction can be made between the datapath and the control logic, and appropriate verification schemes can be applied to each. Datapath units can usually be isolated and verified separately with methods that exploit their structural regularity. Once verified, many datapath elements can be reused across various designs and architectures. Control logic, on the other hand, globally "routes" the flow of data in a design, and thus has to be verified at the level of the entire design. Moreover, control circuitry is invariably custom-made for the architecture and design at hand, precluding the use of previous verification results.

Current verification efforts have tackled control logic verification by generating new mathematical models, typically based on abstraction, that correspond to the RTL description of the design, and utilizing theorem provers to reason about them. Although these models simplify the datapath, they are roughly as complex as the original RTL model. Consequently, hundreds of man-hours are required to manually regenerate the verification model from the RTL model. Moreover, a cumbersome process is required to keep both models consistent, and to prevent subtle bugs from being introduced in the abstract model or masked from the RTL model.

Theorem provers use a number of mathematical approaches to certify that a design complies with its desired functionality, and typically incorporate a number of theories, ranging from zero-, to first-, to higher-order logics, to incrementally prove correctness. In addition to the drawbacks of verifying an abstract model separately from the RTL description, theorem provers are not fully automatic; although equipped with a set of engines on their back-end, the user is required in many cases to guide the power by applying specific engines in the various phases of the proof. In the best case, manual reasoning significantly impedes the verification task for complex designs, and in the average case it makes it completely infeasible. This section provides background information related to the present disclosure which is not necessarily prior art.

SUMMARY

A system and methods are provided for verifying a hardware design for an electronic circuit. The method may include: providing a hardware design description for the electronic circuit; extracting a set of design constraints from the hardware design description, where the set of design constraints represents the electronic circuit in terms of signals and logical operations performed on the signals; creating an abstraction model from the set of design constraints, where the abstraction model abstracts one or more of the logical operations in the set of design constraints by replacing the abstracted logical operations with uninterpreted functions while the signals in the set of design constraints remain unabstracted in the abstraction model; and property checking the abstraction model in relation to one or more design properties. When a violation in the electronic circuit is detected by the property checking step, the feasibility of the violation is then checked and, if the violation is deemed infeasible, the abstraction model is refined.

This section provides a general summary of the disclosure, and is not a comprehensive disclosure of its full scope or all of its features. Further areas of applicability will become apparent from the description provided herein. The description and specific examples in this summary are intended for purposes of illustration only and are not intended to limit the scope of the present disclosure.

DRAWINGS

FIGS. 1A-1C are diagrams illustrating sound and/or complete approximations of a circuit design;

Figure 2A:
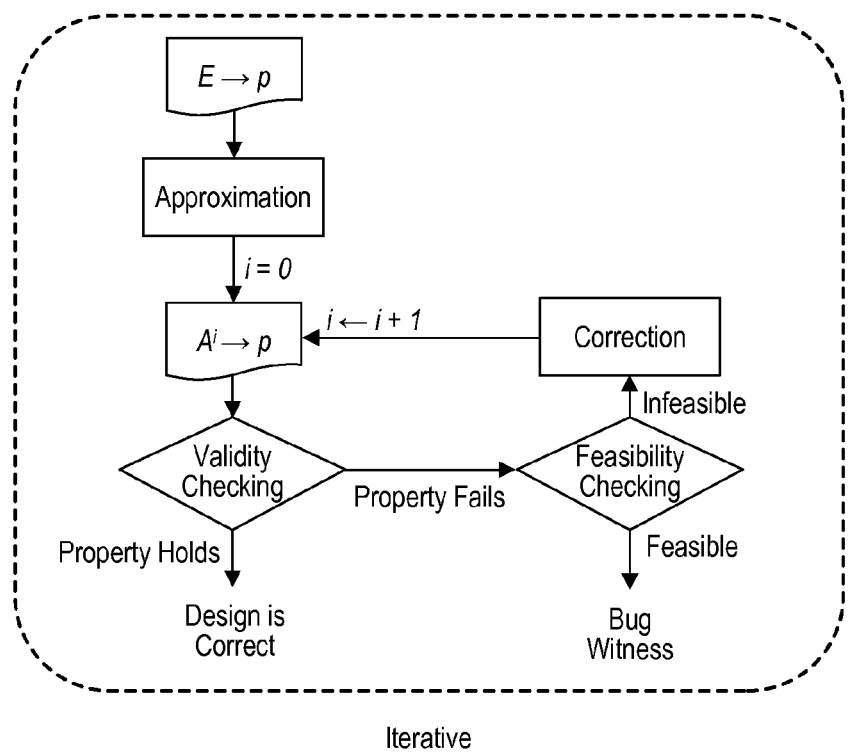
FIGS. 2A and 2B are flowcharts depicting the main steps of a generic iterative approximation/correction approach and a special case based on sound approximations, respectively.

The drawings described herein are for illustrative purposes only of selected embodiments and not all possible implementations, and are not intended to limit the scope of the present disclosure. Corresponding reference numerals indicate corresponding parts throughout the several views of the drawings.

DETAILED DESCRIPTION

An approximation-based framework for hardware verification is set forth in this disclosure. Formalization of the verification task is first presented, followed by a description of the approximation framework. The framework assumes that the design is given as a reactive transition system, which is described via sequential and combinational hardware components that are connected to the inputs and outputs of the design. Each component is characterized by a so-called consistency function that characterizes its functional behavior by relating its outputs and inputs with appropriate constraints. In addition to the design description, the framework requires a sequential bound k, such that the correctness of the design is proven only up to that bound. While requiring a known bound may seem to limit the utility of the approach, empirical observation suggests that it has application in many situations where such bounds are known as priori or can be easily derived from the particular structure of the design. Examples include verification of pipelined microprocessors, packet routers, and dataflow architectures common in filters, etc.

Given the design's description and the bound k, unrolling is used to derive a purely combinational description of the design's transition relation. This process is linear in k and the size of the design. If we let X denote the set of variables in the unrolled description, then the consistency function of each interconnected component i can be described by a constraint $E_i(X)$, and the formula $$X \doteq \bigwedge_{1 \le i \le n} E_i(X)$$

characterizes the entire behavior of the unrolled design. In most cases, verification is done by comparing an implementation design to a specification "design". In these cases exact (X) includes the unrolled versions of both designs.

The verification problem can then be phrased as the question of establishing the validity of the formula exact(X)→prop(X), where prop(X) indicates a specified correctness condition, also known as "verification criterion". An equivalent, but slightly more convenient, form of this formula is exact(X)·(p=prop(X))→p, where p is a free variable (not in X) that represents the property being checked. In this form, the sub-formula (p=prop(X)) can be viewed as the consistency function of the correctness property in the same way that exact(X) is the consistency function of the concrete design. For simplicity, however, and bearing in mind that it can be considered part of exact(X), we will omit (p=prop(X)) from our formulas.

Checking the validity of exact(X) p is typically done by checking the satisfiability of its negation:

$$\phi(X,p) = \text{exact}(X) \cdot \neg p. \quad (3.1)$$

Proving the unsatisfiability of (3.1) establishes that the property holds, while a satisfying solution (X*,0) demonstrates the existence of a design or specification bug.

Except for trivial designs, checking the satisfiability of (3.1) directly is generally infeasible. Instead, in the proposed scheme the property is verified on an approximation of the exact design, which is a partial representation of the design's functionality. For such an approach to work, the approximation must, by construction, be significantly easier to verify than the original design, both computationally and practically. It also must be related to the original design in such a way that verifying it allows deriving conclusions about the original design. Along these lines, we will introduce a generic notion of soundness and completeness with respect to a property p, which are useful for deriving suitable approximations as we will show later. Throughout these definitions, M(X) is used to denote a conjunction of constraints over X that models the design, either exactly or approximately. For brevity, M's explicit dependence on X is omitted.

Definition (Relative Soundness and Completeness) if $(M_1 \to p) \to (M_2 \to p)$ is valid (i.e., holds true for all assignments to X), where $M_1$, and $M_2$ is called a complete approximation of $M_1$.

It is easy to show that soundness, as well as completeness, are transitive, reflexive, and anti-symmetric relations, therefore defining partial orders over the possible models. Since completeness and soundness are dual, we will unify the two orders and use $\prec$ such that $M_2 \prec_p M_1$ if $M_1$ ($M_2$) is a sound (complete) approximation of $M_2$ ($M_1$). If we let E denote the constraints that exactly model the original design (i.e. E=exact(X)), then a soundness and completeness notion can be defined for approximations of E as follows.

Definition (Soundness and Completeness) Approximation A is called sound (complete) if $E \prec_p A (A \prec_p E)$.

Approximations that are sound, complete, or both, can be very useful, particularly when it is significantly easier to check the validity of (A→p) than to check the validity of (E→p) and still draw meaningful conclusions about E. Approximation-based methods are, therefore, based on the idea of deriving an approximation, checking the property on it, and drawing conclusions on the original model. For example, if the property holds on a sound approximation, it will definitely hold on the original model, since $(E \prec_p A)$ ∧ (A→p)→(E→p). Conversely, if the property is violated on a complete approximation, it will definitely be violated on the original model.

We can reason about the space of sound and complete approximations by simplifying the expression in Relative Soundness and Completeness definition.

$$(M_1 \to p) \to (M_2 \to p) \equiv (M_1' + (M_2' + p)$$
$$\equiv M_1 p' + M_2' + p$$
$$\equiv M_2' + M_1 + p$$

-continued $$\equiv M_2 \to M_1 + p$$

$$\equiv M_2 p' \to M_1$$

and replacing $M_1$ ($M_2$) with A (E) to represent soundness, and with E (A) to represent completeness:

Soundness: $E \prec_p A \Rightarrow (A \to p) \to (E \to p) + E \to A + p = \underline{Ep' \to A}$ Completeness: $A \prec_p E \Rightarrow (E \to p) \to (A \to p) + \underline{A \to E + p} = Ap' \to E$ Therefore, any sound and complete approximation A must satisfy $Ep' \to A \to E+p$, which can also be written as $A \in [Ep', E+p]$. In this interval, we have great latitude in choosing the approximation, as illustrated pictorially in FIGS. 1A-1C.

A final set of definitions introduce over- and under-approximations, which are special cases of sound and complete approximations, respectively.

Definition (Relative Over- and Under-Approximation) if $M_1 \to M_2$ is valid, then $M_2$ over-approximates $M_1$, and $M_1$ under-approximates $M_2$.

Similarly to sound and complete approximations, over- and under-approximations define partial orders over the possible models, and are represented with the operator $\prec$. Finally, A is called an over-approximation if $E \prec A$, and an under-approximation if $A \prec E$. It is important to note that over- and under-approximations can be defined without referencing the property p under consideration. As we will shortly show, this will be very useful in our framework.

As mentioned earlier, the goal of verification methods that use approximations is to find a sound and complete approximation that simplifies the verification task. Theoretically, finding such an approximation is as hard as solving the original problem. Practical algorithms, instead, start with an approximation $A^0$ of E that is either sound or complete (but not both), and check the property on it. Then, a sequence of more accurate approximations $A^1, A^2, \ldots, A^k$ is iteratively generated until the property can be proven to fail or hold on E.

Figure 2B:
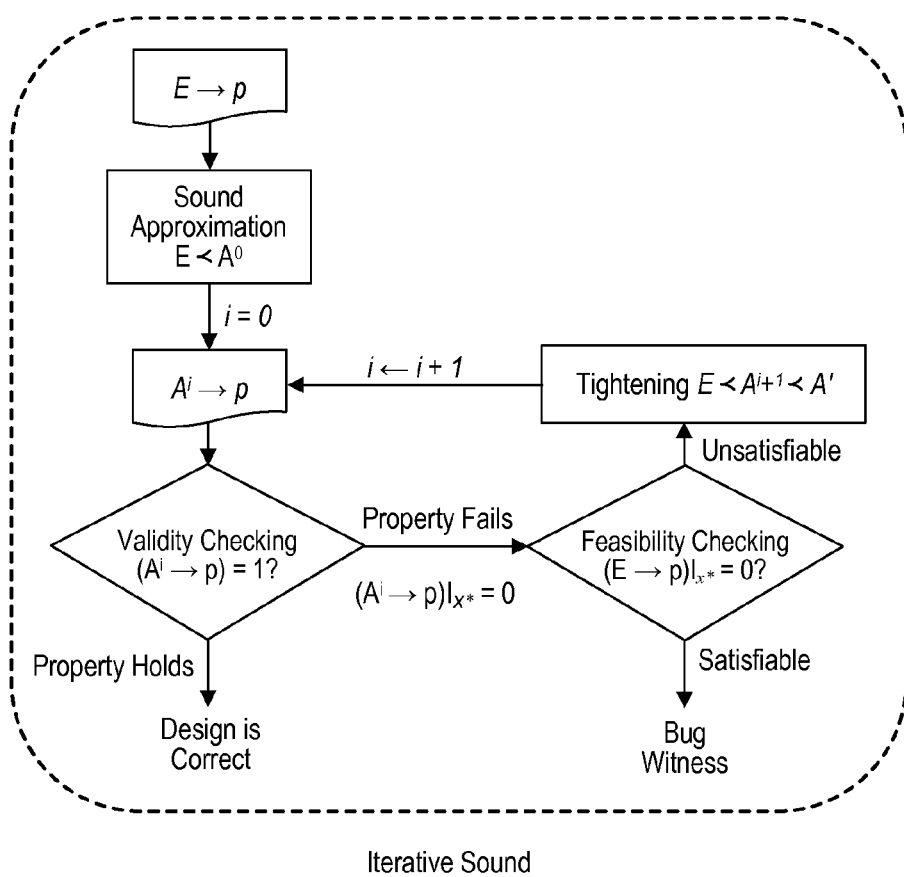

FIGS. 2A and 2B highlight the main steps in this iterative approximation/correction approach. FIG. 2A illustrates the generic approach; whereas, FIG. 2B shows a special case based on sound approximations. The algorithm starts with a sound approximation $A^0$ that is not necessarily complete (i.e. $E \prec A^0$). Then, through incremental tightening, a sequence of more accurate approximations $A^k \prec A^{k-1} \prec \ldots \prec A^1$ is generated such that In iterations $i=0, \ldots, k-1$, the property is violated on $A^i$ but not on E. The violation witness, also called a counterexample, represents a false negative clearly indicating that $A^i$ is not complete. A new approximation $A^{i+1}$ is then derived such that $E \prec A^{i+1} \prec A^i$.

In the last iteration k, one of two scenarios takes place: the property is violated on both $A^k$ and E; or the property holds on $A^k$, i.e. $A^k \to p$. Note that soundness is preserved throughout the process of tightening the approximation. Therefore, if the property holds on the last approximation, then it also holds on the exact model.

In dual algorithm, an initial complete approximation is verified against the property. If the property is violated on the approximate model, it is definitely violated on the original design; otherwise, no conclusion can be made and the approximate model is relaxed to finally obtain a sound approximation for which the property holds.

Figure 3:
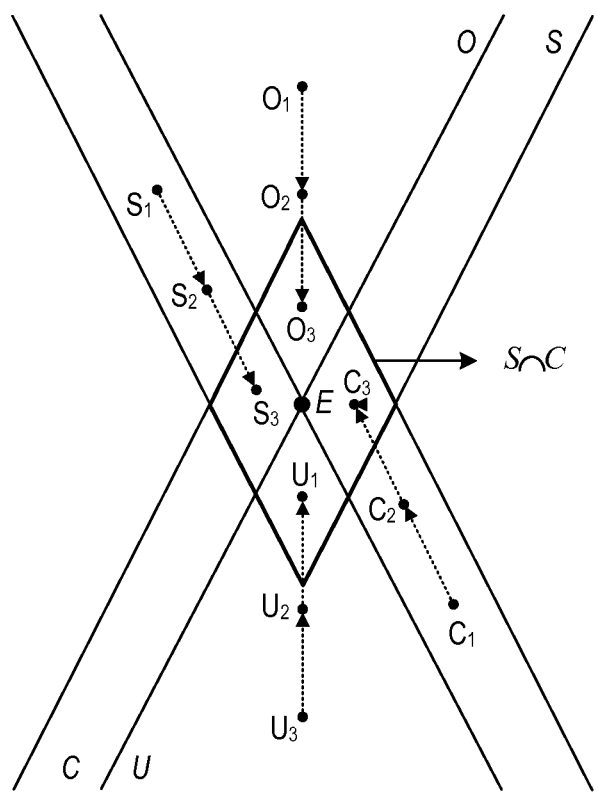
FIG. 3 is a diagram illustrating the space of all possible models of the design.

FIG. 3 describes the space of all possible models of the design, such that each point represents a single model, which can be the exact design (E), or a (sound, complete, over-, or under-) approximation thereof. The diagram also demonstrates the relation between these models. For example, every over-approximation is sound, therefore, $O \subset S$. Finally, the diagram shows the various possible approximation/correction processes, particularly tightening (paths $O_1 \to O_2 \to O_3$ and $S_1 \to S_2 \to S_3$) and relaxing (paths $U_1 \to U_2 \to U_3$ and $C_1 \to C_2 \to C_3$). As described earlier, the algorithm can either terminate when a count and complete approximation is obtained (e.g. $S_3 \in S \cap C$), or in an earlier iteration when a real violation is found.

Both approximation-based approaches (i.e. tightening versus relaxing) are used nowadays in many verification contexts, in hardware as well as software. The traditional verification scheme starts with simulating the design in order to "hunt" for bugs; simulation is a form of approximation-based verification, since the property is verified given a specific input vector. The behavior of the design for this input vector is a complete approximation of the original design. In this context, a false positive refers to the scenario wherein the property is violated by the original design, and the violation is not caught when verifying the approximation (i.e. simulating the design). The presence of false positives is a compromise that designers are willing to make in return for scaling up the verification (i.e. simulation) time. Recent methods guide the simulation based on formal methods, and in turn correct the original approximation to lower the possibility of false positives. This can be considered a form of relaxation.

When reaching a certain level of confidence regarding the correctness of the design, the designer becomes interested in proving the lack of bugs; therefore, the intuitive solution in this case is a "top down" iterative tightening based on sound approximations, such as the algorithm we are presenting.

While an iterative approximation/correction approach is appealing at a conceptual level, its applicability hinges on two main premises. First, the approximation process is computationally easy, such that its benefit outweighs the inherent loss of information that requires correction to make it sound and complete. For instance, linear-time over- or under-approximations can be obtained via relaxing or tightening the design's constraints that are associated with certain components. This can be done independently of the property being checked (this is true for a certain class of properties, such as bounded safety), which gives over- and under-approximations an edge over other types of sound and complete approximations. For example, the full-fledged functionality of an arithmetic unit is replaced with a restricted version that models, say, boundary cases such as an over-flow computation or a division-by-zero flag; this creates an under-approximation of the design. Datapath abstraction, which concerns us in this thesis, is another example of an easy-to-derive over-approximation that is independent of the property.

The second premise is that there exists a sound and complete approximation, that is significantly different than the original design, on which the property can be proven to hold or fail. The existence of any sound and complete approximation, let alone one that significantly differs from the original design, is not always obvious, nor guaranteed. This is especially true when the approach is confined to a class of approximations, such as over-approximations. For example, consider the circuit in FIG. 4, in which a Boolean variable x is compared to y, another Boolean variable that is equivalent to x through the AND gate. In this case exact(X)$\to$p, as it can be inferred from the expression in (c). However, it can be shown by inspection that any over-approximation A obtained by removing one or more constraints from exact(X) is sound but not complete, i.e. $A \to p$. In this case, and many similar cases, applying iterative over-approximation-tightening is likely to be significantly slower than attempting to establish the validity of the exact formula, since the iterative algorithm will gradually tighten the approximation until it is ultimately identical, or very similar, to it. Therefore, the existence of such a "hoped for" approximation, or the lack thereof, can determine whether applying approximation is beneficial, and can assist the verification engineer in developing an intuition regarding its applicability. In the context of datapath abstraction, our method and experimental results confirm the following conjecture:

Conjecture 1—An approximation process, wherein similar datapath components in the implementation and specification are abstracted similarly, leads to an over-approximation that is sound and very close to being complete.

Next, how an iterative approximation/correction approach can be utilized to verify the complex control logic of hardware designs is described. The system performs bounded model checking of safety properties on hardware designs described at the Register Transfer Level (RTL) (e.g. in Verilog). It is understood that extensions of this approach can be applied to other HDLs without compromising the merits of the approach. A typical usage scenario involves providing two Verilog descriptions of the same hardware design, such as a high-level specification and a detailed implementation, and checking them for functional equivalence. Given a Verilog description and a sequential bound k, the system extracts a word-level representation of the design's transition relation and unrolls it k times to create a combinational description of the design, on which the approximation/correction approach can be applied.

An overview of the Verilog hardware description language is provided and the verification problem of Verilog descriptions at the RTL is defined. That is followed with an algorithm based on the approximation scheme described earlier. The approach over-approximates the design by removing datapath-related constraints, and performs verification on the constraints representing the control logic. In this new context, the terms "abstraction" and relaxation" will be used interchangeably to denote over-approximation, and "refinement" will be used to denote correction or tightening.

One of the major differences between RTL and gate-level Verilog is that RTL Verilog descriptions operate at the word-level, i.e. they manipulate words of data, usually referred to as bit-vectors. Datapath elements are usually described using bit-vectors. The control logic, on the other hand, uses single-bit signals to control the computation with the use of multiplexors and logic gates, that are respectively described by conditionals (e.g. if-then-else and switch statements) and Boolean expressions.

Formally, an RTL Verilog description defines a set of signals R, W, I, and M, respectively denoting the registers, wires, inputs and memories in a flat representation of the design. Each signal in (V=R∪W∪I can be either single-bit ($V^C \subset V$) or multi-bid $V^D \subset V)^2$, and signals in M are multi-dimensional arrays of $\overline{bits}$. The interactions of the design components are defined in Verilog via assignments. For example, the Verilog code fragment

```
reg[31:0]r;
always@(posedge clk)
r<=r1+r2;
``` defines the next state of a 32-big register r∈R as a function of other signals in the design, i.e. $r_1+r_2$.

Let X denote the set of variables in the unrolled description. Each interconnected component with output $x_i \in X$ can be described by the consistency constraint $C(X)=(x_i=f_i(X))$ where $f_i(X)$ defines a Verilog word- or bit-level expression:

$$f_i(X) = \begin{cases} c_i & \text{where } c_i \text{ is a constant} \\ in_i & \text{where } in_i \text{ is an input} \\ op_i(x_{j_1}, \ldots, x_{j_n}) & \text{where Verilog operator } op_i \text{ is} \\ & \text{applied to signals } x_{j_1}, \ldots, x_{j_n} \in X \end{cases}$$

The consistency constraint $C_i(x_1, x_2, x_3) \doteq (x_3=x_1+x_2)$, for example, uses the '+' operator to define a word-level constraint that models a 32-bit adder by equating the signal $x_3$ with the sum of $x_1$ and $x_2$, where $x_1$, $x_2$, and $x_3$ are 32-bit signals. Note that a compound constraint can be used to characterize two or more serially connected components. For example, the constraint $C(x_1, X_2, x_3) \doteq (x_3=x_1+x_2 \gg 4)$ uses two word-level operators, namely addition and right-shifting, to compose a constraint that conjoins two simpler ones.

A common way to abstract design's elements is to replace them with terms, uninterpreted functions (UFs), and uninterpreted predicates (UPs). The resulting term-level abstraction maintains the consistency of the removed elements without representing their detailed functionality, and leads to a significant reduction in the size of the design's state space. The abstraction step is followed by property checking and refinement. Property checking determines if the abstracted design satisfies the specified property. Refinement determines if the abstraction was sufficient to establish whether the property holds or fails on the concrete design and, if otherwise, to refine the abstraction accordingly.

As mentioned earlier, term-based abstraction can be viewed as a relaxation of the system of constraints that characterize the concrete design. Specifically, if each concrete consistency constraint $C_i(X)$ is relaxed to a corresponding abstract consistency constraint $A_i(\hat{X})$, where X and $\hat{X}$ denote the concrete design signals and their corresponding abstractions, we can model the abstract design by the formula $$abst(\hat{X}) = \bigwedge_{1 \leq i \leq n} A_i(\hat{X}).$$

Note that conc(X)→abst($\hat{X}$)., where conc(X) corresponds to exact(X) introduced above.

Formally, we introduce α(·) to denote the abstraction process. α(·) maps the concrete variables and operators to appropriate abstract counterparts. Specifically, if ξ is a concrete variable or operator, its abstract counterpart is denoted by α(ξ)=ξ̂. Applying α(·) to the concrete constraint $C(x_1, \ldots x_k)$ yields α($Cx_1, \ldots, x_k$))=α(C)(α($x_1$), ..., α($x_k$))=$\hat{C}(\hat{x}_1, \ldots, \hat{x}_k)$. In general, any expression involving concrete variables and operators can be abstracted recursively applying α(·) to its sub-expressions. For example, applying α(·) to the constraint $C(R_1, R_2, R_3) \doteq (R_3=R_1+R_2 \gg 4)$ yields $$\alpha(R_3 = R_1 + R_2 \gg 4) = (\alpha(R_3) = \alpha(+)(\alpha(R_1), \alpha(R_2 \gg 4)))$$

$$= (\alpha(R_3) = \alpha(+)(\alpha(R_1), \alpha(\gg)(\alpha(R_2), \alpha(4))))$$

Using the mappings α(+)=add,α(≫)=shift,α($R_i$)=$\hat{R}_i$, and α(4)=four, we have A($\hat{R}_1$, $\hat{R}_2$, $\hat{R}_3$)=($\hat{R}_3$ add($\hat{R}_1$,shift($\hat{R}_2$, four))).

Different types of abstraction can be defined based on an appropriate mapping between the concrete constants, variables, and operators, and their abstract equivalents. Conceptually, this applies also to other abstraction methods. Furthermore, this approach can take advantage of the design hierarchy, and apply abstraction to the design at different levels of granularity. For instance, an entire datapath unit, such as the ALU, can be replaced with a single UF or UP. Such heterogeneous abstraction can be automated based on syntactic rules, and can also allow manual, yet fairly intuitive, intervention in the abstraction process. While (manual) hierarchy-based abstraction has been mainly used with theorem proving, our approach focuses on automating the abstraction at the level of the design signals, and therefore $\alpha(\cdot)$ is defined for each signal in the design.

In addition to abstracting combinational elements with $\alpha(\cdot)$ tractable verification may require the abstraction of memory arrays. Applying only term-based abstraction to an n-word by m-bit memory yields an n-term abstraction. For memories of typical sizes in current designs, n is on the order of thousands to millions of words. Memory abstraction allows modeling an n-word memory by a formula whose size is proportional to the number of write operations, $\dot{K}$, rather than to n. Note that memory abstraction is distinct from term-based abstraction. A useful mnemonic device is to think of term and memory abstraction as being, respectively, "horizontal" and "vertical;" they can be applied separately, as well as jointly.

The system implements memory abstraction using lamda expressions. In particular, the expression $M^r(x)=\lambda_x.\text{ite}(x=A, D, M(x))$ describes the next state of a memory array M after a write operation with address A and data D. The operate ite is an if-then-else construct simulating a multiplexer. Replacing memory writes with ite expressions and UF applications is performed during the process of unrolling, such that the final formula is lambda-free.

For example, the Verilog code fragment set forth below describes the behavior of a 16-word memory that has two ports, one for reading and one for writing, and the table describes the state of all the design signals, including the memory array, in the first four cycles of execution after initialization.

Figure 4:
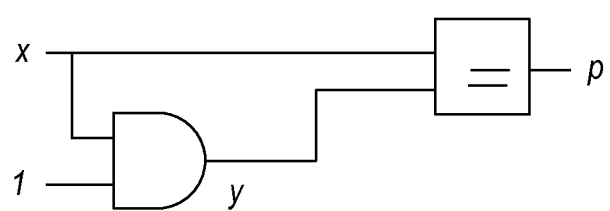
FIG. 4 is a schematic for a simple equivalence circuit.

Figure 4.1
A Dual Port Memory in Verilog reg [31:0] Mem [15:0]; // Memory Array
reg [3:0] Addr; // Address of Write Port
reg [3:0] Read; // Address of Read Port
reg [31:0] Data; // Data for Write and Read Ports
reg en; // Enable signal for Write Port
initial begin
    en = 1'b0;
    Addr = 4'd0;
    Data = 32'd0;
end
always[a] begin
assign Read = Mem[4'd1]; // Reading the content of location 32'd1.

[a] In most cases, memory writes are synchronized on a clock edge. In this example, however, we omitted any clock specifications to simplify the exposition.

TABLE 4.1

Symbolic Unfolding of Memory using Lambda Expressions

| C | Mem[a] | en | A | D | Read[b] |
|---|---|---|---|---|---|
| 0 | Mem(x) = $\lambda_x.M(x)$ | 0 | 0 | 0 | M(1)[c] |
| 1 | Mem(x) = | 1 | 1 | 1 | M(1) |

TABLE 4.1-continued

Symbolic Unfolding of Memory using Lambda Expressions

| C | Mem[a] | en | A | D | Read[b] |
|---|---|---|---|---|---|
|   | $\lambda_x.\text{ite}(0 \wedge (x = 0), 0,$ $M(x)) = \lambda_x.M(x)$ |   |   |   |   |
| 2 | Mem(x) = $\lambda_x.\text{ite}(1 \wedge (x = 1), 1, M(x)) =$ $\lambda_x.\text{ite}(x = 1, 1, M(x))$ | 0 | 2 | 2 | ite(1 = 1, 1, M(1)) = 1 |
| 3 | Mem(x) = $\lambda_x.\text{ite}(0 \wedge (x = 2),$ 2, ite(x = 1, 1, M(1))) = ite(x = 1, 1, M(1)) | 1 | 3 | 3 | ite(1 = 1, 1, M(1)) = 1 |
| 4 | Mem(x) = $\lambda_x.\text{ite}(1 \wedge (x = 3),$ 2, ite(x = 1, 1, M(1))) = ite(x = 3, 3, ite(x = 1, 1, M(x))) |   |   |   | ite(1 = 3,3, ite(1 = 1, 1, M(1)))) = 1 |

[a] The transition function for Mem in this case is: Mem'(x) = $\lambda_x.\text{ite}(en \wedge (x = Addr), Data, Mem(x))$.
[b] The value of the Read port is the instantiation of Mem(x) with x = 1.
[c] Since the memory is not initialized in Verilog, the UF M is used to represent the initial memory state.

Two write operations are performed on the memory; the value 1 is written at location 1, and the value 3 is written at location 3. The read port, which always samples the content of the memory in location 1, reads the value stored originally in the memory in cycles 0 and 1, and reads the value 1 starting at cycle 2, due to the write operation that was performed in the previous cycle.

Given these abstraction mechanisms, the algorithm performs the satisfiability check on the abstraction of formula (3.1), i.e., $$\hat{\phi}(\hat{X},p)=\alpha(\phi(X,p))=\alpha(\text{conc})(\alpha(X))\cdot\alpha(\neg p)=\text{abst}(\hat{X})\alpha(\neg)\alpha(p). \quad (4.1)$$

Using an appropriate abstraction operator, (4.1) can be considerably simpler than (3.1), facilitating its quick solution by a suitable satisfiability checker. Next, we will define the soundness criterion for this abstraction scheme, and then describe two families of term-based abstraction.

To reason about soundness, note that $\alpha(\cdot)$ maps Verilog equality to the interpreted equality predicate between terms. Thus $\hat{\phi}(\hat{X},p)$ has to adhere to two basic rules; equality transitivity, and functional consistency.

Definition (Equality Transitivity) Equality Transitivity w.r.t. any three terms $(t_1=t_2) \wedge (t_2=t_3) \rightarrow (t_1=t_3)$.

Definition (Functional Consistency) Functional Consistency w.r.t. any two sets of terms $x_1, \ldots, x_n$ and $y_1, \ldots, y_n$ and a UF or UP f of arity n, is defined by the relation $[(x_1=y_1) \wedge \ldots \wedge (x_n=y_n)] \rightarrow [f(x_1, \ldots, x_n)=f(y_1, \ldots, y_n)]$. To relate $\hat{\phi}(\cdot)$ with $\phi(\cdot)$, we have to show that the set of constraints arising in $\hat{\phi}(\cdot)$ are implied by the concrete formula $\phi(\cdot)$. To do so, we examine the constraints affecting $\hat{\phi}(\cdot)$ based on its structure and semantics.

Consider for example the concrete constraint $C(x_1,x_2,x_3) \doteq (x_3=x_1+x_2)$ introduced earlier. It embeds three different constraints implicitly; a "fan-in constraint" defining the relation $C(x_1,x_2,x_3)=(x_3=f(x_1,x_2))$ for some function $f$; a "domain constraint" defining the possible values of the variables, in this case $0 \le x_1,x_2,x_3 < 2^{32}$; and a "semantics constraint" defining the exact interpretation of $f$, which is 32-bit addition in this case. Fan-in, domain, and semantics constraints in $\phi(\cdot)$ are denoted by $\mathbb{F}$, $\mathbb{D}$, and $\mathbb{S}$, respectively; and their counterparts in $\hat{\phi}(\cdot)$ are $\hat{\mathbb{F}}$, $\hat{\mathbb{D}}$, and $\hat{\mathbb{S}}$. The relation between these sets is described as follows:

The abstraction preserves the connectivity of the circuit, i.e., $\hat{\mathbb{F}} = \mathbb{F}$, which can be easily shown to hold in our case from the definition of $\alpha(\cdot)$.

A necessary condition for $\alpha(\cdot)$ to perform over-approximation is that it is a 1-1 function w.r.t. variables. Consider, for example, conc=[p=(x=y)], and an (erroneous) abstraction $a_{err}(\cdot)$ such that $\alpha_{err}(p)=p$ and $\alpha_{err}(x)=\alpha_{err}(y)=\hat{z}$. In this case $\alpha_{err}(conc)\alpha_{err}(X)=[p=(\hat{z}=\hat{z})]$, and we can show that $[p=(\hat{z}=\hat{z})\rightarrow p]\rightarrow[p=(x=y)\rightarrow p]$ does not hold, i.e., $[\alpha_{err}(conc)\alpha_{err}(X)\rightarrow p]\rightarrow[conc(X)\rightarrow p]$ is not true. Therefore, we require in our framework that $\alpha(x)=\hat{x}$ for each variable $x \in X$, where $\hat{x}$ is a "relaxed" version of x, and in turn we have $\mathbb{D} \rightarrow \hat{\mathbb{D}}$. Relaxation, as we will shortly see, can be done by removing the bound constraints altogether.

With these restrictions, $\hat{\phi}(\cdot)$ over-approximates $\hat{\phi}$ if $\mathbb{S} \rightarrow \hat{\mathbb{S}}$. Next, two types of abstraction are defined, and show that the above implication, and in turn soundness, holds true for each type.

To perform abstraction to the logic of Equality with Uninterpreted Functions, commonly referred to as EUF, the set of design signals X is divided into (single-bit) control signals and (multi-bit) data signals, denoted by $X^C$ and $X^D$ respectively. $X^C$ and $X^D$ in the unrolled design represent their counterparts $V^C$ and $V^D$ in the original design description. Generally speaking, and as hinted by the notation, datapath calculations are performed with signals in $X^D$, whereas control logic is defined with signals in $X^C$. Classifying a signal as a datapath or a control signal as a datapath signal or vice versa does not compromise the correctness of the approach. Specifically, a control signal that is abstracted as part of the datapath might yield a spurious counterexample and cause an increase in the number of refinement iterations. The less probable scenario of misclassifying a datapath signal as a control signal causes the abstract model to be unnecessarily detailed and possibly makes the property checking step intractable. Experimental results show that the overall algorithm is robust and quite scalable despite control/data intermixtures that may lead to these scenarios.

By the same token, $O^C$ and $O^D$ are used respectively to denote the control and data operators. A control operator is one that performs logical operations, i.e. conjunction, disjunction, and negation, on single-bit signals. All other operators are considered data operators. Note that an operator is the occurrence of a symbol in a specific constraint, rather than the mere syntactic token representing it. This is important since Verilog, like other HDLs, defines the semantics of each operation based on its context. For example, the constraint $C_i(x_1, x_2, x_3) \doteq (x_3 = x_1 + x_2)$, uses a 32-bit operator to perform addition; the symbol '+' might have semantics elsewhere. As we will see later, the abstraction process uses 'context' information to determine the abstract counterpart of each Verilog operator.

In order to be geared towards control logic verification, datapath abstraction removes the detailed functionality of the datapath elements, such as adders, shifters, etc. The interactions among the control signals, however, are preserved making it possible to perform meaningful verification of safety properties on the design's control logic. Along these lines, consider the class of abstractions (based on over-approximation via $\alpha(\cdot)$ that leave the control logic unabstracted; i.e., $\alpha(\cdot)$ is the identity function when applied to $X^C$ or $O^C$. For instance, $a(\neg c)=a(\neg)a(c)=\neg c$. Leaving the control logic in its concrete state preserves enough precision that allows discovering bugs in the control logic.

In this case, $\hat{\phi}(\cdot)$ is a formula in the quantifier-free first order logic (FOL) defined by the following rules:

Terms: (a) A non-propositional variable in a term. (b) If $f$ is an n-argument function symbol (n≥1) and $t_1, \ldots, t_n$ are terms, then $f(t_1, \ldots, t_n)$ is a term.

Atoms: (a) A propositional variable (taking values from 0, 1) is an atom. (b) If P is an n-argument predicate symbol (n≥1) and $t_1, \ldots, t_n$ are terms, then $P(t_1, \ldots, t_n)$ is an atom.

Formulas: (a) An atom is a formula. (b) If $\phi$ and $\psi$ are formulas, then so are $\neg \phi$, $\phi \wedge \psi$, and $\phi \vee \psi$.

EUF also introduces the if-then-else construct it $e(a,t_i,t_j)$ as an abbreviation for the term which is equal to $t_i$ the atom a is 1, and is equal to $t_j$ otherwise.

Definition (EUF Abstraction) $\alpha^E(\cdot)$ performs abstraction to the EUF logic by leaving the control logic unabstracted (i.e., modeled via Boolean and ite constructs).

Figure 5A:
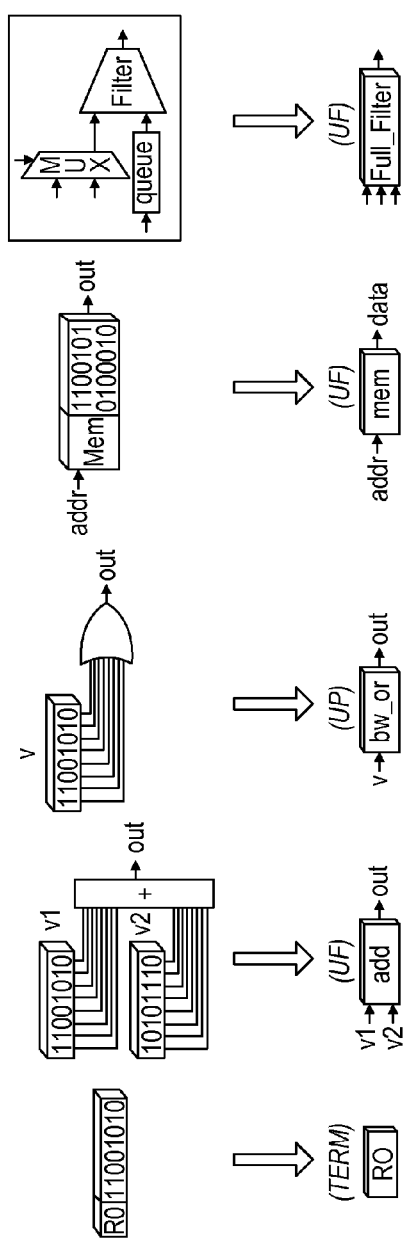
FIGS. 5A and 5B are diagrams illustrating EUF abstraction and its effect on datapath and control logic components, respectively.
Figure 5B:
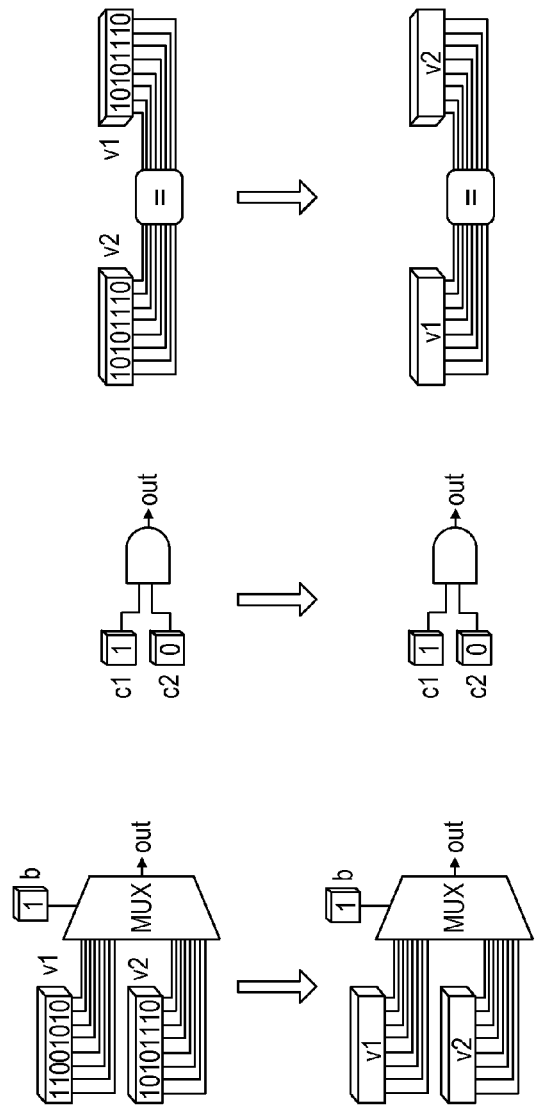
Figure 6A:
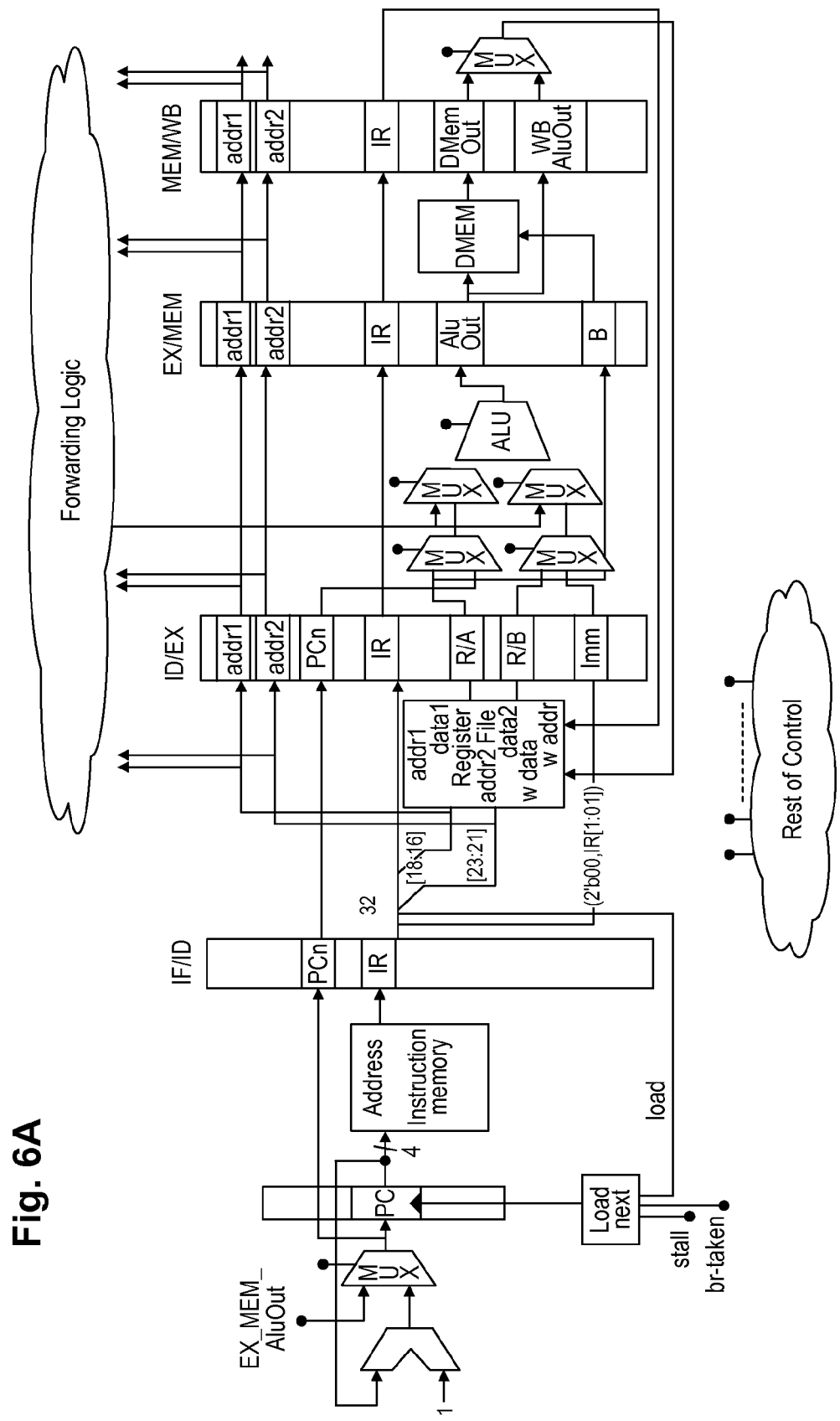
FIGS. 6A and 6B are diagrams demonstrating datapath abstraction to EUF when applied to a 5-stage MIPS-like microprocessor pipeline.
Figure 6B:
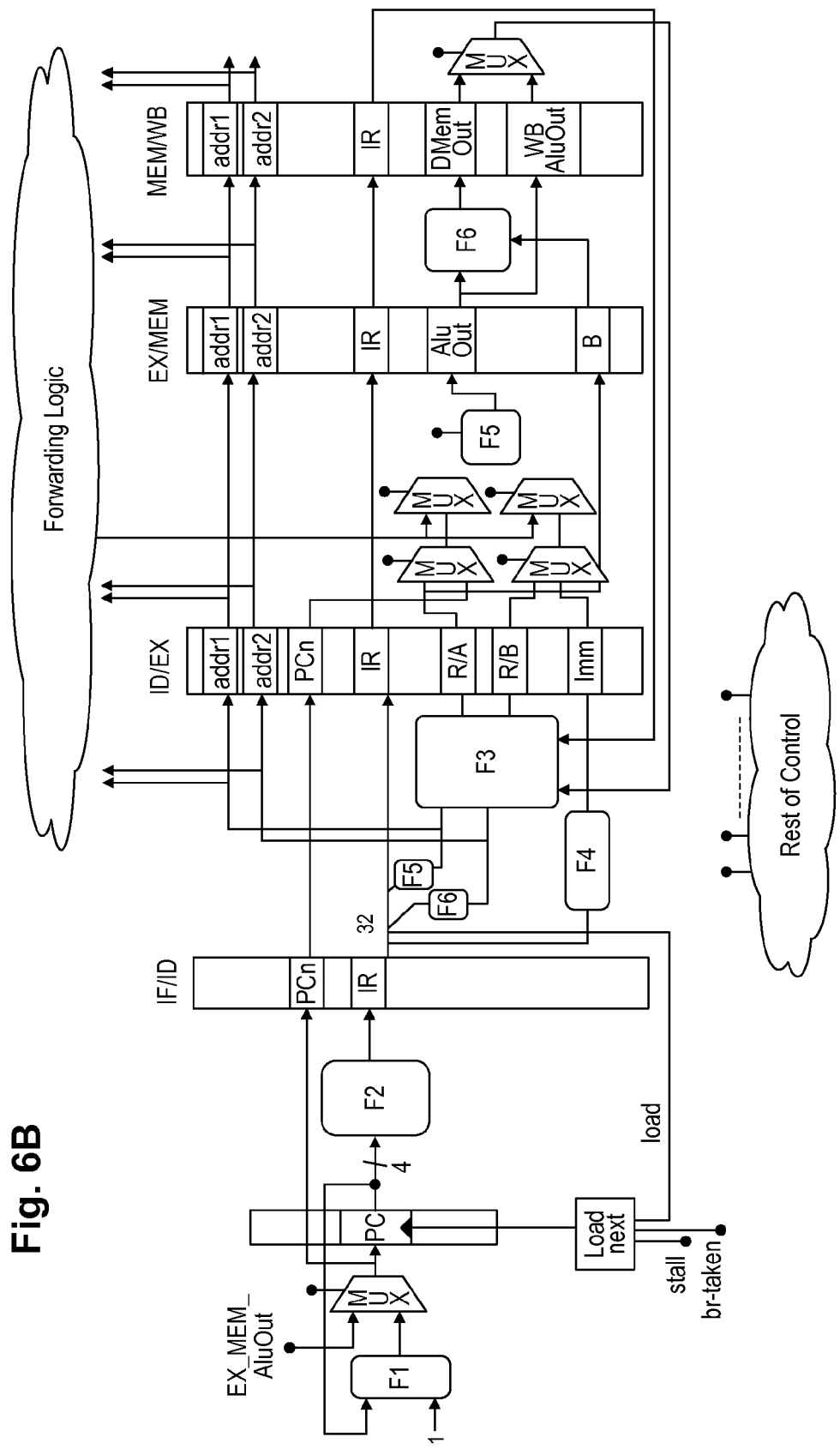

FIGS. 5A and 5B describes EUF abstraction and its effect on datapath and control logic components, respectively. FIGS. 6A and 6B demonstrates datapath abstraction to EUF when applied to a 5-stage MIPS-like microprocessor pipeline. Note that this datapath abstraction mechanism does not determine the way terms are modeled. In particular, since the only interpreted operators acting on terms are equalities, we have freedom in how to model the terms, including leaving them uninterpreted. The choice of the specific abstraction has implications on validity checking, as well as refinement. The SMT solver YICES, for instance, treats uninterpreted terms as integers and so does our algorithm. Formally the abstract term of a datapath signal $d \in X^D$ will be denoted by the interger $\hat{d}$, i.e. $\alpha^E(d)=\hat{d} \in N$. In the rest of the disclosure will use $\hat{X}$ and abst ($\hat{X}$) to respectively denote $\alpha^E(X)$ and $\alpha^E(conc)(\alpha^E(X))$. The abstraction of any expression $e \in EXP$ is performed by recursive application of $\alpha^E(\cdot)$ as described earlier.

To illustrate EUF abstraction, consider the exemplary Verilog "design" found in the appendix. The verification objective is to prove that signal p is always true, indicating that the design satisfies the condition $(a=o) \rightarrow (d=f)$. The formula representing the concrete constraints of this design can be derived by inspection, and is also given in abstract.

Using the semantics of bit-vector operations, such as extraction, concatenation, and shifting, along with the standard Boolean connectives, this formula can be translated in a straightforward fashion to propositional CNF so that it can be checked for satisfiability by standard SAT solvers. In fact, for this simple example it is quite easy for a modern SAT solver to prove that $conc \wedge \neg p$ is unsatisfiable which is the same as saying that $conc \rightarrow p$ is valid.

The objective, however, is to establish this result using abstraction and refinement. A possible abstraction of this design is given in abstract, where detailed bit-vector operations have been replaced by UP and UF symbols. For example, EX1 is a UP that corresponds to extracting the most significant bit of $\alpha$, and SR2 is a UF that corresponds to a right shift of b by two bits. Terms in this abstract formula, i.e. variables that correspond to bit-vectors in the concrete formula, are now considered to be unbounded integers. They can be compared for equality to enforce functional consistency but are otherwise uninterpreted having lost their concrete semantics. On the other hand, variables in the abstract formula that correspond to single bits in the concrete formula (such as m and l) retain their Boolean semantics and can be combined with the standard Boolean connectives.

As mentioned above, a necessary condition for the soundness of $\alpha^E(\cdot)$ is that it is a 1-1 function w.r.t. variables. In fact, $\alpha^E(\cdot)$ has to also be 1-1 w.r.t. operators as well. Consider, for example, the case where $\alpha^E(\cdot)$ maps both {x,3'b000} and {x,2'b00} to concat($\hat{x}$,zero). This abstraction is not sound, since the operator { } has different semantics in either case;

this leads to a scenario wherein concat($\hat{x}$,zero)=concat($\hat{x}$, zero) is valid, while {x,3'b000}={x,2'b00} is not. The two expressions should, therefore, be mapped to two distinct UFs under $\alpha^E(\cdot)$. The following lemma articulates that, in the general case, the over-approximation criterion mentioned above is both necessary and sufficient.

Lemma 1—If $\alpha^E(\cdot)$ is a 1-1 function, i.e. it maps distinct concrete variables to distinct abstract variables, and it maps distinct data path operators to distinct UFs and UPs, then it is an over-approximation.

Let x* be a full assignment such that $\phi(x^*)=1$ and $\hat{\phi}(\hat{x}^*)=0$, where x* and $\hat{x}$* assign similar values to corresponding variables in $\phi(\cdot)$ and $\hat{\phi}(\cdot)$. $\phi(x^*)=1$ implies that: $\mathbb{F}(x^*)=\mathbb{D}(x^*)=\mathbb{S}(x^*)=1$; and since $\mathbb{D} \to \hat{\mathbb{D}}$ and $\mathbb{F}=\hat{\mathbb{F}}$, we have $\hat{\mathbb{F}}(\hat{x}^*)=\hat{\mathbb{D}}(\hat{x}^*)=1$, and in turn $\hat{\mathbb{S}}(\hat{x}^*)=0$. Let the constraint $\hat{s}\in\hat{\mathbb{S}}$ be violated, i.e. $\hat{s}(\hat{x}^*)=0$. $\hat{s}$ cannot be an equality transivity constraint, since this type of constraint has to always hold for full assignments. Therefore, $\hat{s}$ is a functional consistency constraint. Since $\alpha^E(\cdot)$ is 1-1 w.r.t. to UFs/UPs and variables, $\gamma(\hat{s})$ involves a single Verilog operator applied on two inputs of equal value under x*, and producing dis-equal values under x*; therefore $\gamma(\hat{s})(x^*)=0$. Functional consistency has to hold for all operators, i.e. $\mathbb{S} \to \gamma(\hat{s})$, and since $\gamma(\hat{s})(x^*)=0$ we have $\mathbb{S}(x^*)$.

In the algorithm, a 1-1 $\alpha^E(\cdot)$ function is enforced with the use of a naming convention for UFs and UPs. In particular, since operator semantics in Verilog are defined by its operation as well as the size of its arguments, the name of a UF or UP is a concatenation of the operator type and argument sizes. For example, a 32-bit addition is abstracted to the UF called 'add__32__32'.

Finally it is worth mentioning that since $\alpha^E(\cdot)$ is 1-1, its inverse $\gamma^E(\cdot)$ is well-defined. $\gamma^E(\cdot)$ remaps terms back to their corresponding multi-bit variables, and remaps uninterpreted functions to their corresponding bit-level counterparts. The use of $\gamma^E(\cdot)$ will be evident in the refinement back-end of our algorithm.

CLU is a quantifier-free first-order logic that extends EUF with separation constraints and lambda expressions. Separation constraints allow the use of limited counting arithmetic useful in modeling certain hardware constructs such as memory pointers. Lambda expressions allow aggressive, albeit consistent, abstraction of memories. Note that we "borrow" Lambda expressions to model memory arrays even when using the UEF logic; thus, the main difference between EUF and CLU in this case is counting. $\alpha^C(\cdot)$ is used to differentiate CLU abstraction from EUF abstraction ($\alpha^E(\cdot)$).

The use of counting in CLU is done using an interpreted operator succ$^c$ that allows adding an integer constant c to an abstract variable $\hat{x}$. Note that such use would not have been feasible if abstract variables are represented with non-integer constructs, such as bit-vectors.

In hardware design, there are two frequent occurrences of addition and subtraction of constants. The first occurrence, which is rather implicit, is in the use of any stand-alone constant c; in essence, c is equivalence to succ$^c(\hat{0})$. Constants are used frequently in decoders, such as in IR[3:0]=4'b0101 (succ$^5(\hat{0})$); or in the control logic in counters, such as in cnt==3'd4 (succ$^4(\hat{0})$). The second use of constant addition is in the incrementing of counters, such as in cnt<=cnt+4'd1 (succ$^1(\hat{cnt})$;

In order to remain sound, the abstraction of constant addition with the interpreted succ operator in CLU has to guarantee that $\alpha^C(\cdot)$ is a 1-1 function. This is always true in the case of constants; $\alpha^C(c)$ can always be modeled with succ$^c(\hat{0})$ regardless of the size of the bit-vector representation of c in Verilog. The latter is true since any two constants of the same value; but of different bit-width, are still equal according to Verilog semantics. In practice, we use the interpreted addition operator only with small constants. Constants that are greater than a pre-defined threshold are abstracted similarly to variables, in order not to overload the abstract solver.

This no longer holds for counting. If $\alpha^C(\cdot)$ is obvious to the size of x, then it will always abstract x+c with succ$^c(\hat{x})$, although overflow occurs differently depending on the bit-width of x and the value C. In general, it is possible to assume that counters do not overflow as done in [4]. In particular, one can rewrite certain counters to remove implicit overflow. For example, the counter cnt<=cnt+1 for a 2-bit variable cnt can be replaced by cnt<=ite(cnt==2'd3,2'd0,cnt+1), and in turn eliminate any possible overflow. In practice, it is quite feasible to require designers to adhere to a coding style that avoids implicit overflow with constant addition and subtraction.

Early EUF solvers convert $\hat{\phi}(\cdot)$ to an equi-satisfiable propositional formula using a suitable encoding. On the other hand, Satisfiability Modulo Theories (SMT) solvers, such as YICES, operate on these formulas directly by integrating specialized "theory" solvers within a backtrack propositional solver. SMT solvers are, thus, able to take advantage of the high-level semantics of the non-propositional constraints (e.g., EUF constraints) while at the same time benefiting from the powerful reasoning capabilities of modern propositional SAT solvers.

Given the (over-approximated) abstract formula $\hat{\phi}(\cdot)$, the algorithm checks its satisfiability using an SMT solver. If the solver determines that $\hat{\phi}(\cdot)$ is unsatisfiable, the algorithm halts concluding that the property holds. Otherwise, an abstract counterexample is produced and the refinement phase is invoked.

In this type of abstraction, where terms are integer variables, a satisfying solution to formula (4.1) is an assignment of integers and Booleans, respectively, to the terms and atoms in the variable vector $\hat{X}$:

$$\hat{X}^* = viol(\hat{X}) \doteq \bigwedge_{1 \leq i \leq |\hat{X}|} \hat{x}_i = \hat{c}_i,$$

where $\hat{c}_i$ is the constant value assigned to $\hat{x}_i$ (the $i^{th}$ element of $\hat{X}$). As stated, viol($\hat{X}$) represents a "point" in the space of possible assignments to the variables of formula (4.1), such that it is consistent with the abstract constraints but inconsistent with the correctness property. This is indicated by introducing the satisfiable "violation" formula $$v(\hat{X},p) \doteq \hat{\phi}(\hat{X},p) \cdot viol(\hat{X}) = abst(\hat{X}) \cdot \neg p \cdot viol(\hat{X}), \quad (4.2)$$

that succinctly captures the result of the validity check.

An exemplary and basic refinement type is described, that is based on refuting spurious counterexamples. In the refutation-based refinement, a spurious abstract counterexample is viewed as "undesirable" behavior, and one or more succinct explanations are used to refine the abstraction for the next round of checking. This is similar to clause recording, or learning, in SAT solvers.

To determine if the violation reported by the validity checker is a real violation, we need to evaluate it on the concrete formula. This step, referred to as feasibility checking, can be accomplished by applying $\gamma(\cdot)$ to (4.2) yielding:

$$\gamma(v(\hat{X},p)) = \gamma(abst)(\gamma(\hat{X})) \cdot \neg p \cdot \gamma(viol)(\gamma(\hat{X})) = conc(X) \cdot \neg p \cdot cviol(X), \quad (4.3)$$

where cviol(X) is the concretization of the abstract violation. The 'E' superscript of α and γ are omitted in this description and when obvious from the context. Unlike the rest of the formula elements, concretizing constants is not obvious since the variables in the abstract formula are unbounded integers; some assignments will not, therefore, fit within the bound of the originating concrete bit-vector. However, this problem can be avoided altogether by a more suitable representation of the violation, as explained in the next section.

In general, the process of feasibility checking consists of determining the satisfiability of (4.3). If (4.3) is found to be satisfiable, then the violation reported by the validity checker is a real violation indicating a real design (or specification) bug. If (4.3) is found to be unsatisfiable, then the violation is spurious. This triggers abstraction refinement, which strengthens the abstraction by eliminating this violation from it for the next round of validity checking. A superscript is used to denote the index of the iteration, such that $\hat{\phi}^0(\hat{X},p)$ denotes formula (4.1). The $i^{th}$ iteration of the abstraction-refinement loop then consists of the following computations:

Step 1: Validity Check: Check the satisfiability of $\hat{\phi}^{i-1}(\hat{X},p)$. If unsatisfiable, exit reporting "property holds."
Step 2: Violation Derivation: Derive $viol^i(\hat{X})$ from the solution X* in step 1.
Step 3: Feasibility Check: Check the satisfiability of $\gamma(v(\hat{X},p)) = \gamma(\hat{\phi}^{i-1}(\hat{X},p) \cdot viol^i(\hat{X}))$ If satisfiable, exit reporting "property fails."
Step 4: Abstraction Refinement: Compute the new formula $\hat{\phi}^i(\hat{X},p) = \hat{\phi}^{i-1}(\hat{X},p) \cdot \neg viol^i(\hat{X})$ and go to 1. $\neg viol^i(\hat{X})$ will be called a "lemma" in this disclosure.

In order for refutation to be practical, steps 2 and 3 have to be computationally easy; and for fast convergence, the violation used for refinement should eliminate as many spurious behaviors as possible.

Figure 7:
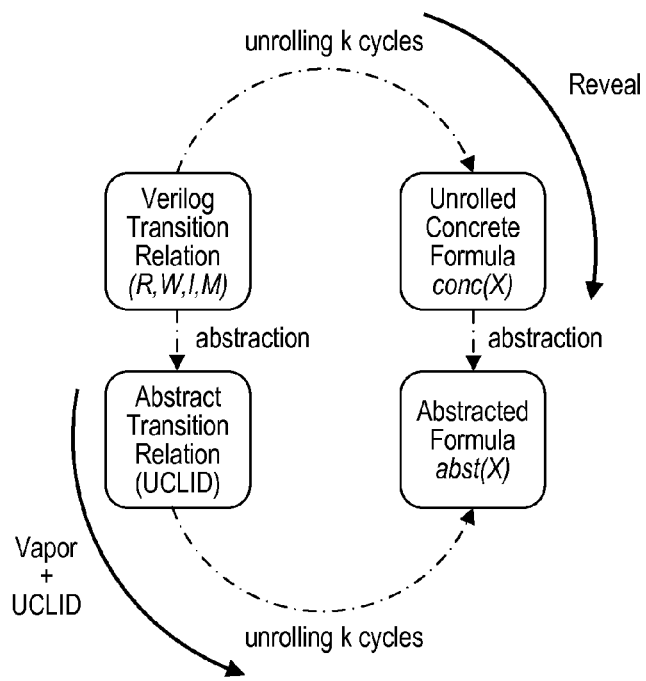
FIG. 7 is a diagram showing two ways of computing an abstract formula.

This section focuses on the soundness of the abstraction, as well as the interaction between the abstraction and unrolling processes, and the latter's impact on soundness. FIG. 7 shows two ways of computing an abstract formula $abst(\hat{X})$ using abstraction and unrolling. Starting from a Verilog Transition Relation over the variables R, W, I, and M, unrolling produces the concrete formula conc(X), which is in turn abstracted to $abst(\hat{X})$ via $\alpha(\cdot)$ as described above. As illustrated in the figure, the same result can be obtained via producing an abstract transition relation first, followed by unrolling to create $abst(\hat{X})$. Soundness is explained by:

Describing a generic approach that performs abstraction to UCLID, followed by unrolling and solving.
Refining the previous approach with the use of Vapor for abstraction. The result is a sound abstract-then-unroll method.
Describing a sound unroll-then-abstract method that we use in this disclosure.

The UCLD language allows defining sequential term-based abstract models. This language supports two basic data types, TRUTH and TERM. It also supports two function types: FUNC which maps a list of TERMs to a TERM, and PRED which maps a list of TERMs to TRUTH. These types are combined using operators from the following set:

Boolean connectives for TRUTH constants and variables.
Equality (=) and ordering (<,>) relations which operate on TERMs and return TRUTH.
Interpreted functions succ and pred which take a TERM and return, respectively, its successor and predecessor. These functions allow modeling counters and represent a limited form of integer arithmetic.
The ITE (if-then-else) operator which selects between two TERMs based on a Boolean condition.
Uninterpreted PRED symbols or Lambda expressions that take TERM arguments and return a TRUTH
Uninterpreted FUNC symbols or Lambda expressions that take TERM arguments and return a TERM.

The rationale behind a sound Verilog-to-CLID abstraction is explained with a small Verilog example and a series of improved abstractions.

Consider the Following Verilog Fragment

```
reg [7:0] v;
wire s;
always @(posedge clk)
    if(s)
        v[7:0] <= v[7:0] & 8'h0F;
    else
        v[3:0] <= v[5:2] | 4'h2;
```

As a first-order approximation, the abstraction of such Verilog description to UCLID can be thought of as a syntactic mapping between related variable types in the two languages. For instance, single- and multi-bit signals in Verilog can be mapped, respectively, to TRUTH and TERM variables in UCLID. These mappings, in turn, induce corresponding mappings between Verilog operators and UCLID logical connectives, UFs, and UPs. Such an approach basically assumes that multi-bit signals and the function units that operate on them should be automatically abstracted.

If s is abstracted to TRUTH variable S, and v[7:0], v[3:0] and v[5:2] are respectively abstracted to the TERMs $V\_7\_0$, $V\_3\_0$ and $V\_5\_2$, a (resulting) intuitive UCLID abstraction, which we call $ABST_1$, is given below. Note that temporal abstraction of the clock signal 'clk' is modeled with the function 'NEXT', which represents a single cycle 'advancement' of the transition relation.

```
NEXT[V_7_0]:=ITE(S,AND(V_7_0,const15),V_7_0);
NEXT[V_3_0]:=ITE(!S,OR(V_5_2,const2),V_3_0);
```

Another possible abstraction, which removes more constraints from the UCLID model, and thus is coarser, is:

```
NEXT[V_7_0]:=ITE(S,FREE_V_7_0,V_7_0);
NEXT[V_3_0]:=ITE(!S,FREE_V_3_0,V_3_0);
```

In this abstraction, called $ABST_2$, arbitrary values are generated using 'free inputs' denoted by the prefix FREE. This bears some similarity to localization reduction, which abstracts state variables by turning them into free inputs.

Finally, the coarsest abstraction will be called $ABST_3$, and is given by:

```
NEXT[V_7_0]:=FREE_V_7_0;
NEXT[V_3_0]:=FREE_V_3_0;
```

$ABST_3$, is sound, since it is completely unconstrained. It is also easy to see that it is too coarse and does not serve as a meaningful abstraction. A meaningful and sound abstraction is derived similarly to $ABST_1$ and $ABST_2$ above, with a counter-intuitive caveat: $ABST_1$ and $ABST_2$ are not actually sound for the following reason. When s=0 in the Verilog model, v[3:0] is modified due to the assignment in the 'else' branch, but more importantly v[7:0] is implicitly modified by virtue of its relation with v[3:0]; on the other hand; V_7_0 remain unchanged in the abstraction when S is false, disallowing a corresponding transition from taking place in the UCLID model. A similar analysis can also be carried out for the case of s=1.

A possible fix is given by $ABST_4$ as follows:

```
NEXT[V_7_0]:=ITE(S,AND(V_7_0,const15),FREE_V_7_0);
NEXT[V_3_0]:=ITE(!S,OR(V_5_2,const2),FREE_V_3_0);
```

This abstraction is similar to $ABST_1$, except that the state of both UCLID variables is 'refreshed' on either sides of the branch. In other words, when the branch is taken, V_7_0 gets assigned a value based on the RHS of the Verilog assignment; when it is not taken, a fresh arbitrary value is assigned. A dual abstraction is used for V_3_0.

For this example, soundness is guaranteed by modeling every possible transition for each bit field of v. On the other hand, it is possible to constrain the UCLID model further without compromising soundness of the abstraction. In particular, the algorithm in Vapor [4] uses a more 'refined' abstraction, such that the arbitrary symbolic values given 'FREE' are replaced with UCLID expressions that relate each bit-vector with its bit fields. The following section describes the abstraction mechanism in Vapor.

As shown above, multi-bit signals typically consist of bit fields that are individually accessed for reading and/or writing. Correct abstraction in such cases must account for the relation among the bit fields and between each bit field and its parent vector. Furthermore, a naïve abstraction may lead to the unintended abstraction of critical control signals that are grouped in Verilog as multi-bit vectors, making the abstract UCLID model too coarse to be usable in verification. Finally, abstraction of certain Verilog operators may lead to the generation of spurious errors since functional abstraction guarantees consistency under equality but is oblivious to properties such as associativity and communtativity; for example abstracting integer addition with the UF add(x,y) will insure functional consistency but will not treat add(x,y) as identical to add(y,x) as required by commutativity of addition.

The above observations suggest that an abstraction algorithm must not only examine the declared signal types in Verilog but also the way such signals are "used" in the body of the Verilog description. How Vapor abstracts various Verilog constructs to corresponding ones in UCLID is described further.

Based on their "bit structure" Verilog variables are classified into three main types. Single-bit variables which are 2-valued and naturally modeled as UCLID TRUTH variables. Multi-bit words which are viewed as unsigned integers and translated into corresponding UCLID TERM variables. Word arrays which typically denote memories or register files and are conveniently represented by UCLID UF variables. Except for the abstraction of bit vectors, these mappings are straightforward. Bit vectors require additional machinery to insure that their abstraction is consistent. Specifically, given a Verilog bit vector X, we must not only create a UCLID TERM to represent X but also create additional TERMs to represent each of its individually-accessed bit fields. Furthermore, we must introduce a set of uninterpreted functions that relate these TERMs to each other. Otherwise, UCLID treats these TERMs as completely independent, potentially leading to the generation of numerous false errors, or to the generation of unsound abstraction.

Without loss of generality, assume that X is a vector of n bits such that X[n−1] is the most significant bit. It is convenient to view X as the interval [n−1:0]. Assume further that the set of individually-accessed bit fields of X is denoted by $X^F$. Thus, $X^F$ is a set of possibly overlapping subintervals of [n−1:0]. Finally, let $\pi(X^F)$ denote the coarsest partition of [n−1:0] induced by $X^F$. For example, if X is [15:0], and $X^F$=[15:0],[15:8],[7:0],[10:3], then $\pi(X^F)$=[15:11],[10:8],[7:3],[2:0].

Consistency can now be established by introducing TERMs for each of the bit fields in $X^F$ and $\pi(X^F)$ and a corresponding set of complementary uninterpreted extraction and concatenation functions that relate these TERMs. These functions are designed to insure that whenever a bit field in $X^F$ is changed, appropriate updates are made to all the other bit fields that overlap it. These functions are named according to the naming convention described in above, in order to insure soundness. In particular, extraction functions are named extract_m_w(X) to indicate the extraction of w bits from bit vector X starting at bit position m. Without loss of generality, bit vectors are assumed to be numbered such that bit 0 is in the least significant position. Similarly, concatenation functions are named concat_$w_1$_..._$w_k$($X1$, ..., $X_k$) to indicate the concatenation of k bit vectors $X_1$ ..., $X_k$ whose bit widths are $w_1$, ..., $w_k$. A similar naming convention is adopted for TERM and TRUTH variables; e.g., the Verilog bit vector X[a:b] is declared as the TERM X_a_b.

A Verilog example illustrating the usage of bit fields is provided below.

```
// signal declarations
reg [16:0] word;
wire [7:0] w_low,w_high;
wire [16:0] out;
wire parity,clk;
// Verilog fragment with explicit and implicit
// access to bit fields of 'word'
reg mode; always @(posedge clk)
    if (mode == 1'b1)
        word[10:3]<=8'b11001110;
    else
        word<={parity,{w_high,~w_low}};
assign out = word;
// Equivalent Verilog fragment where all implicit
// accesses to bit fields of 'word' are made explicit
always @(posedge clk)
    if (mode == 1'b1)
        word[10:3]<=8'b11001110;
    else begin
        word[16]<=parity;
        word[15:8]<=w_high;
        word[7:0]<=~w_low;
assign out = word;
```

Figure 8A:
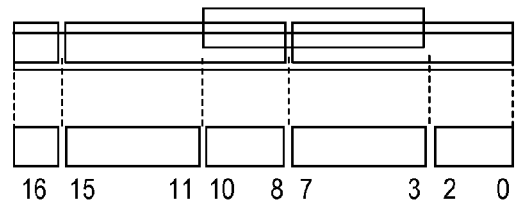
FIGS. 8A and 8B are diagrams depicting the abstraction of a bit field relations for 'word' and the corresponding UCLID abstraction, respectively.
Figure 8B:
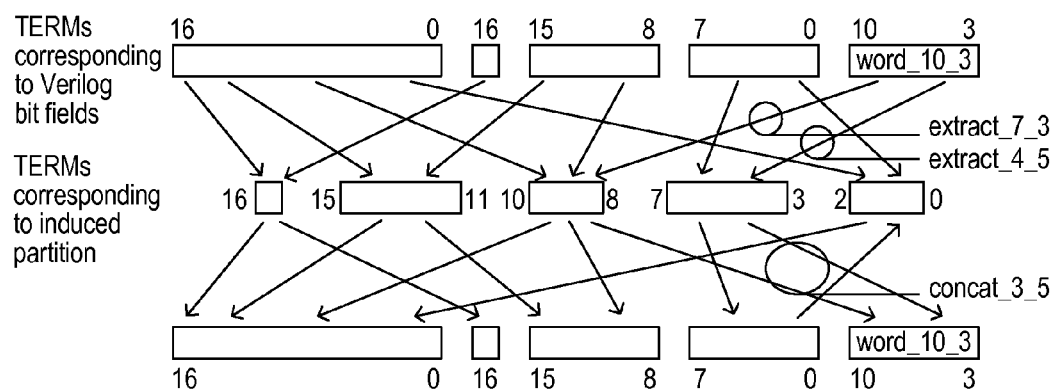

FIGS. 8A and 8B depict a bit field relations for 'word', and the corresponding UCLID abstraction, respectively. Consider, in particular, how the bit vector word[7:0] gets updated. From the Verilog fragment, it is clear that portions of word [7:0] are assigned to in both branches of the if statement. Specifically, when mode is equal to 1, the five most significant bits of word[7:0] (i.e. word[7:3]) may change because of the assignment to word[10:3]. And when mode is equal to 0, word[7:0] is assigned the value of $w_low$. These updates are facilitated by introducing the following UCLID TERMs and associated uninterpreted functions:

mode_0_0, word_10_3, and word_7_0 to denote the Verilog variable mode, and the individually-accessed bit fields word[10:3] and word{7:0]

Word_P_2_0 and word_P_7_3 to denote the bit fields of word in the induced partition; word_P_7_3_n is a temporary TERM that denotes the next vale of word_P_7_3

The UF extract_4_5( ) which relates word_7_3 to word_10_3; word_7_3 is derived from word_10_3 by extracting 5 bits starting from the fourth most significant bit position the UF concat_5_3( ) which reconstructs word_7_0 from word_P_7_3_n and word_P_2_0 the UF bitw_not_8_( ) which represents bitwise negation applied on w_low_7_0.

The update of word[7:0] is now achieved as follows:
1. word[7:0] is initialized to some arbitrary symbolic constant.
2. When mode is equal to 1, word[10:3] is assigned an uninterpreted constant value.
3. The next value of word[7:0] is set to bitw_not_8 (w_low) if mode is equal to 0 or, if mode is equal to 1, to the concatenation of the new value of its 5 most significant bits and the old value of its 3 least significant bits.

The general scheme described above can be simplified in certain situations and such simplifications can lead to significantly more efficient translations from Verilog to UCLID. For example, if the individually-accessed bit fields of a Verilog bit vector are mutually disjoint, it is not necessary to introduce additional TERMs for the partition blocks. Extraction may also be simplified when applied on constants. These optimizations reduce the size of the propositional formula generated by UCLID since UCLID encodes TERMs using a bit string whose length is a function of the total of TERMs and UFs applications being processed. Furthermore, we found that such an optimization eliminates many unnecessary false errors by avoiding the need for using extraction UFs.

In the process of obtaining the coarsest refinement over a set of bit vectors, some of the blocks in the resulting partition may end up being single bits. These single-bit fields can be modeled as TERMs and used in extraction and concatenation as described above. This, however, might allow them to get more than 2 different symbolic values. In such cases, we use UPs, instead of UFs, as extraction functions. When the block (TRUTH variable) needs to be concatenated, it has to be "type cast" to TERM, using an appropriate ITE expression.

The abstraction and unrolling processes in Vapor examine the coarsest partition of all Verilog variables, maps each bit field in this partition to a UCLID variable, and defines the abstraction based on $\alpha^E(\cdot)$ or $\alpha^c(\cdot)$ as described previously. In this section, we describe an improvement to the abstraction/unrolling processes such that:
   the unrolling and abstraction processes remain sound and close to complete;
   the refinement process automatically strengthens the abstraction in an on-demand fashion, eliminating the need for correlating bit fields upfront, as done in Vapor; and, finally,
   the unrolling-abstraction diagram (FIG. 7) is commutative; i.e. the resulting abstract formula abst($\hat{X}$) is oblivious to the order of applying unrolling and abstraction.

Consider the Verilog example introduced above involving a register "v" of size 8 bits. The individually-accessed bit fields of v are in this case $v^F=\{[7:0],[5:2],[3:0[\}$, which can be divided into two sets: bit fields accessed in the LHS of any Verilog assignment, denoted by $v^{LF}=\{[7:0],[3:0]\}$, and the rest, denoted by $v'=\{[5:2]\}$. As illustrated earlier, Vapor examines the coarsest partition entailed by $v^F$, in this case $\pi(v^F)=\{[7:6],[5:4],[3:2],[1:0]\}$. On the other hand, the approach set forth herein examines the coarsest partition entailed by $v^{LF}$, ie $\pi(v^{LF})=\{[7:4],[3:0]\}$. The rationale behind this is twofold. First, expressing the change in the 'state' of variable v can be rewritten to the following:

```
wire s;
always @(posedge clk)
    if(s) begin
        v[3:0] <= v[3:0] & 4'hF;
        v[7:4] <= v[7:4] & 4'h0;
    end else
        v[3:0] <= v[5:2] | 4'h2;
```

Representing v using v[3:0] and v[7:4], which have no bits in common, allows a straightforward, yet sound, mapping to TERMs v_3_0 and v_7_4 and proceeding with the abstraction. Alternatively, unrolling based on the state of variables v[3:0] and v[7:3] can be done first, followed by the abstraction of the resulting formula. The final abstract formula is similar in either case.

The practicality of this scheme relies on the fact that the methodology deploys a refinement back-end, allowing any false negatives arising from interacting bit-fields to be resolved automatically. For example, v[5:2] appears only in a RHS expression. This means that (1) it does not need to participate in the state modeling of v, and (2) it can be expressed in the final concrete or abstract formula using v or using the combination of v[3:0] and v[7:4]. If false negatives are to arise due to these interactions, the refinement back-end will automatically resolve them.

Experiments show that the implementation details of the abstraction/refinement approach can directly and greatly affect performance. In particular, a number of techniques were found to be crucial for convergence, and essential to the overall performance of the approach. The first group of techniques allow distilling powerful lemmas from abstract counterexamples in a process referred to as generalization. Using these lemmas to refine the abstract counterexample was essential for fast convergence of the refinement loop. The second group of techniques allow generating one or more extremely succinct lemmas in each refinement iteration, and therefore further speeding up the convergence and overall performance significantly.

The counterexample reported by the validity checker can be viewed as a very specific violation. Checking the feasibility of such a violation is trivial, since it can be done through SAT propagation in equation (4.3). On the other hand, the violation cannot be used to derive a useful refinement since it "encodes" only one particular case, and out-of-bound constants cannot be concretized as described earlier. At the other extreme, the checker can declare that the property is violated, without reporting any information. This corresponds to requiring viol($\hat{X}$)=cviol(X)=1, leading to an expensive feasibility check when checking the satisfiability of (4.3). This, in fact, amounts to doing the verification at the bit level without any abstraction. In this case there is no need for refinement; if (4.3) is satisfiable, a bug is reported; otherwise, the property holds.

In between these two extremes, there is great latitude to choose a suitable representation of the violation, subject to the following objectives:
   It should be efficient to derive;
   It should be efficient to check feasibility on;
   It should provide effective refinement.

When a violation is detected and checked against the concrete model, it is observed that only a very small subset of the model's components participate in causing the property to be falsified. A justification process similar to that used in ATPG can identify those constraints (i.e. function boxes, "gates") that participate in the implication chains leading to p being false.

Pseudo-code for a counterexample generalization algorithm and supporting data structure are provided below:

```
1. struct {
2.     string name;
3.     enum {UF, ite, tvar} type;
4.     union {
5.         // list of inputs to UF
6.         list<term> inputs;
7.         // inputs to ite
8.         atom cond;
9.         term thenterm, elseterm;
10.    }
11.    unsigned value;
12. } term;
13. struct {
14.    string name;
15.    enum {UP, EQ, NOT, OR, AND, pvar} type;
16.    union {
17.        // list of gate inputs
18.        list<term> inputs;
19.        // inputs to EQ
20.        term left, right;
21.    }
22.    bool value;
23. } atom;
24. // either P (P = 1) or !P (P = 0)
25. struct {
26.    // either UP or EQ
27.    atom P;
28.    bool V;
29. } relation;
30. // list of (potential) violations
31. list<relation> viol;
```

```
1. void EvalFormula(atom f){
2.     // C-style 'fall-through' switch
3.     switch (f.type){
4.         case EQ: {relation r = {EvalTerm(f.left) =
                EvalTerm(f.right), f.value};
5.             viol.insert(r); break;}
6.         case UP: {relation r = {f.name(EvalTerm(f.inputs)),
                f.value);
7.             viol.insert(r); break;}
8.         case OR:
9.         case AND: if (f.value==!controlling(f.type))
                EvalFormula(f.inputs);
10.                else { for (input in f.inputs)
11.                    if
                       (input.value==controlling(f.type))
12.                        {EvalFormula(input); break;}
13.                }
14.            break;
15.        case NOT: EvalFormula(f.inputs); break;
16.        case pvar: break; // do nothing
17. } // EvalFormula
18. term EvalTerm(term t){
19.     switch (t.type){
20.        case UF: return f.name(EvalTerm(f.inputs));
21.        case ite: if (t.cond.value==1)
22.            return EvalTerm(t.thenterm);
23.            else return EvalTerm(t.elseterm);
24.        case tvar: return t;
25. } // EvalTerm
26. void GeneralizeCE(atom 'abst->prop'){
27.    viol={};
28.    EvalForomla('abst->prop');
29. } // GeneralizeCE
```

The C-like pseudo-code describes the formation of viol(X) which incorporate four key techniques:

Enlarging the footprint of the violation by replacing the concrete assignments to the terms with equalities or inequalities between terms Creating a very compact representation of viol($\hat{X}$) based on the primary inputs of the design.

Excluding the elements of the concrete design that do not fall in the Code Of Influence (COI) of the violation assignment.

Excluding all the control elements (interpreted operators) of the concrete design.

The rationale behind the last technique is that the abstract model automatically accounts for the constraints of the interpreted operators in $\phi(X)$. Therefore, incorporating these constraints in viol($\hat{X}$) for feasibility checking overloads the SAT solver with redundant constraints, leading to a potential slow down in the feasibility checking process, as well as reducing the footprint of the violation.

The algorithm traverses $\phi(\cdot)$, starting from the top node, and recursively invokes the procedures EvalTerm and EvalFormula. Given a term variable t when applying X*, by evaluating the interpreted operators in its sub-tree. EvalFormula is invoked on formulas, including atoms, and it constructs the violation by calculating simplified atoms and their value under X*. We use the auxiliary function 'controlling', traditionally defined for logic gates as controlling(AND)=0 and controlling(OR)=1.

Given a spurious violation, i.e. viol(X) such that conc(X)·¬ p·γ(viol($\hat{X}$)) is unsatisfiable, it is possible to further widen the footprint of the learnt lemma by explaining the unsatisfiability of the aforementioned formula via Minimally Unsatisfiable Subsets, or MUSes for short. An MUS is an unsatisfiable subset of the formula that becomes satisfiable if any constraint is removed. The use of MUSes allows the refinement in the current iteration to 'block' violations that might occur in future iterations. Formally, one or more explanations are extracted as follows:

$$mus_k(X) = \text{EXPLAIN}_k(conc(X) \cdot \neg p \cdot \gamma(viol(\hat{X})))$$

$$abst\_mus_k(\hat{X}) = \alpha(mus_k(X))$$

$$expl_k(\hat{X}) = abst\_mus_k(\hat{X}) \cap viol(\hat{X})$$

In other words, MUS extraction is applied on the USAT formula, to explain the infeasibility of the counterexample. An exemplary algorithm for extracting MUS is described by M.Liffiton and K. Sallah in "Algorithms for Computing Minimal Unsatisfiable Subsets of Constraints", Journal of Automated Reasoning 40 (2008) which is incorporated herein by reference. Other types of algorithms for computing MUS also fall within the scope of this disclosure. In this disclosure, the procedure EXPLAIN$_k$ represents the process of extracting the k denoted by mus$_k$(X). Then, the abstraction is used to map the MUS back to the original abstract constraints, and the subset of these constraints originally belonging to viol($\hat{X}$) is the final explanation of infeasibility. The refinement, in turn, uses one or more lemmas each represented by $\neg expl_k(X)$. Since $\neg expl_k(X)$ is a subset of viol($\hat{X}$), the lemma $\neg expl_k(\hat{X})$ is more compact and has wider impact on the abstract model than $\neg viol(\hat{X})$, hence using MUS-based explanation speeds up the refinement convergence as we will see in the experiments. The efficient implementation of MUS extraction in CAMUS and its tight integration with the rest of the refinement algorithm allows this step to remain very fast despite the worst case theoretical complexity of MUS extraction.

Concretization refinement is an alternative refinement technique used to analyze the abstract counterexample and, in case it is spurious, to concretize parts of the design in order to eliminate it. Concretization is the inverse of abstraction, i.e., it restores the bit-vector semantics for the refined parts, which were initially abstracted away by UFs. Unlike refutation refinement, which refines by aggregating lemmas, concretization refinement modifies $\alpha(\cdot)$ to eliminate the current counterexample, and possibly other similar ones that may occur in future iterations.

Concretization bears slight similarity to "unhiding" registers in localization reduction with two clear distinctions.

the violation $\hat{X}_{viol} \subseteq \hat{X}$, $\beta(\hat{X}_{viol})$ defines a set of design variables and corresponding cycles. The set of operators linking signals in which we will denote by $O_{viol}$, can then be concretized. In other words, the abstraction is modified such that $\alpha(op)=op$ for any $op \in \hat{O}_{viol}$.

A more effective refinement is performed based on the observation that spurious counterexamples usually arise due to control/data intermix. Furthermore, if a spurious counterexample appeared due to the logic in a specific cycle, it is very likely that similar spurious counterexamples will arise, in another cycle, based on the same circuit components. Therefore, the concretization in the automated verification system is applied, in all cycles, to the components related by the spurious violation. In particular, $$\alpha^{i+1}(op) = \begin{cases} op & \text{If there exists } j \in N \text{ and } v \in V \text{ such that } (v, j) \in \beta(\hat{X}_{viol}) \text{ and } op \text{ is connected to } v \text{ in cycle } j \\ \alpha^i(op) & \text{Otherwise} \end{cases}$$

Localization reduction operates on gate-level descriptions, wherein the abstraction removes the entire logic that drives certain (bit-) registers; whereas concretization-based DP-CEGAR operates on word-level descriptions and uses UF-based abstraction, making it a better candidate for equivalence checking.

To allow the representation of a "partial" abstraction, in which parts of the datapath are concrete, multi-bit vectors remain unabstracted; in other words, the terms originated from them are represented as bit-vectors. Let $\alpha_i(\cdot)$ denote the abstraction used in iteration i. Initially, each Verilog expression $e \in EXP$ is abstracted by recursive application of $\alpha_0(\cdot)$, which abstract all multi-bit operators via UFs/UPs, while leaving multi-bit signals unabstracted, i.e., $\alpha_0(x)=x$ for any $x \in X^D$. The abstraction of operators is similar to the one described in the previous section except that the domain and ranges of Ufs/Ups are finite-size vectors.

The feasibility and refinement steps proceed as follows. A satisfying solution to (4.1) is an assignment of bit-vector values and Booleans to the terms and atoms in the variable vector $\hat{X}$. If we view atoms as single-bit vectors, the abstract counterexample can be written as $$X^* = viol(\hat{X}) \doteq \bigwedge_{1 \leq i \leq |\hat{X}|} \hat{x}_i = \hat{c}_i$$

where $\hat{c}_i$ this time are constant bit-vector values. Similarly to the previous section, $viol(\hat{X})$ represents a "point" in the space of assignments to the variables of $\hat{\phi}$; thus a similar enlargement can be used to obtain a representation based on (dis-) equalities of bit-vectors.

The $i^{th}$ iteration of the abstraction-refinement loop consists of 4 steps, the first three of which are similar to the refutation-based CEGAR. The last step performing the refinement is significantly different. Instead of using the violation to refute the abstract counterexample, it is used as a seed to pin-point parts of the design that should be concretized.

In order to do that, the automated verification system maintains an annotation map $\beta: \hat{X} \rightarrow V \times N$ such that $\beta(\hat{x})=(v,i)$ indicates that $\hat{x}$ in the abstract formula corresponds to design's signal v at cycle i. $\beta$ is incrementally calculated during the unrolling with marginal cost. Given the signals in It is readily understood that other refinement techniques also fall within the broader aspects of this disclosure.

Figure 9:
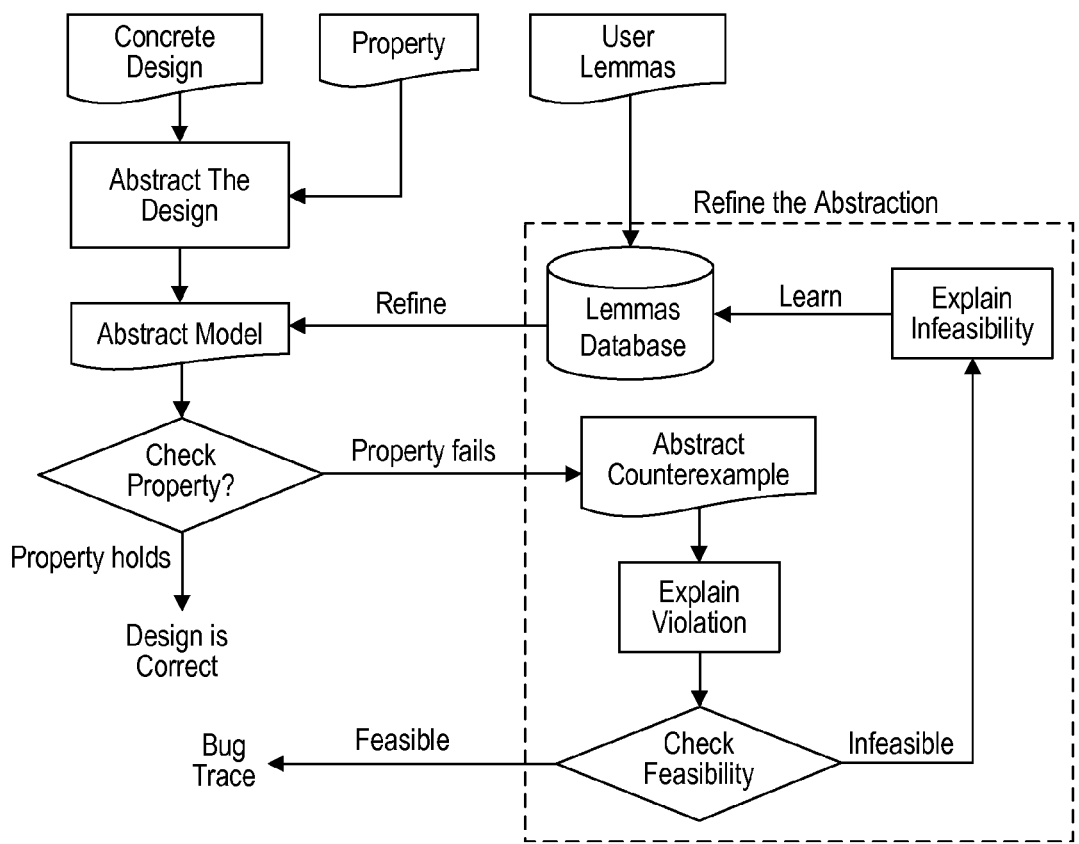
FIG. 9 is a diagram of the architecture for the automated verification system implemented in accordance with this disclosure.

FIG. 9 depicts an overall architecture for an automated verification system, based on datapath abstraction and counterexample-guided lemma-based refinement (DP_CEGAR), described above. Starting with a hardware design for an electronic circuit, a hardware design description can be formulated for the circuit. A set of design constraints is extracted from the hardware design description, where the design constraints represent the electronic circuit in terms of signals and logical operations performed on the signals. For example, the design is initially unrolled to create a bit-vector formula that represents the design and the property. Unrolling applies a number of optimizations, such as isolating the property's code of influence, or simplifying memory expressions. Most of these simplifications are orthogonal to the abstraction and are related to constant propagation in multiplexers.

Next, the design is abstracted to form an abstraction model. The abstraction step over-approximates the design's constraints via uninterpreted functions (UFs) and uninterpreted predicates (UPs). In an exemplary embodiment, the logical operations in the set of design constraints are replaced with uninterpreted functions while the signals in the set of design constraints remain unabstracted in the abstraction model. It is further envisioned that only select logical operations in the set are abstracted. For example, a system design may select which logical operations or types of operations are initially abstracted. In other embodiments, logical operations and signals (or subsets thereof) may be abstracted to form the abstraction model.

The abstraction model is then property checked in relation to one or more design properties. In the exemplary embodiment, the abstraction model is checked using a satisfiability or validity solver. When the design properties hold, the hardware design is correct; whereas, when the design properties fail, the solver outputs an assignment of variables that represent a violation of the design properties. While reference has been made to a satisfiability modulo theories solver, other types of solvers as well as other property checking techniques are contemplated by this disclosure.

When the design properties fail, the abstraction model may be refined and rechecked. First, the abstract counterexamples output by the solver are checked for feasibility. In the exemplary embodiment, feasibility is assessed by conjoining the abstract counterexamples (i.e., the violation) with the initial set of design constraints and inputting the conjoined set into the solver. More specifically, select variable assignments in the assignment are replaced with relationships between variables to form a set of constraints that represent the violation, conjoining the set of constraints that represent the violation with the set of design constraints to form a conjoined set and inputting the conjoined into the solver. If the solver outputs another assignment, the violation is deemed feasible and reported by the system as an actual design defect. On the other hand, if there is no assignment by the solver, then the violation is deemed in feasible. In this case, the abstraction model can be refined using the violation. Broader aspects of this disclosure contemplate other techniques for checking feasibility of a counterexample.

From a violation, one or more lemmas are created and stored in a database, where a lemma is created by negating the set of constraints that represent the violation. The lemmas are in turn stored in a database for subsequent iterations. The database of lemmas (a) allows the flexibility of aggregating one or more lemmas in each refinement iteration; (b) allows the user to supply lemmas before the verification begins for the design at hand; and (c) allows reusing lemmas across verification sessions invoked on different versions of the same design, or different designs of the same "family of designs".

The architecture may employ other techniques for refining the abstraction model as discussed above. For example, select abstracted logical operators in the abstraction model may be unabstracted and then used to form the refined abstraction model. The steps of property checking and feasibility checking are then repeated using the refined model.

An exemplary implementation of the automated verification system is further described and may be referred to herein as the Reveal verification tool. The automated verification system is comprised of various components. The Hardware Relations library is a stand-alone package that is used to manipulate word-level expressions. The Reveal system uses it as its platform for communicating Verilog expressions, as well as abstract lemmas. The Formula Generator described is the system's front-end module. It is used to generate conc(X). The Solver Module is Reveal's back-end module for solving SMT formulas. The MUS Extractor is another back-end module responsible for extracting infeasibility explanations from SMT formulas. The CEGAR Core orchestrates the entire process as described previously. Each of these components are further described below.

Hardware Relations module allows the Reveal system to efficiently store and manipulate word-level expressions throughout the entire flow, as well as to be extensible and applicable to other uses, such as the verification of software. To achieve that, it has to trade off three requirements simultaneously:

it has to scale in space and time;
it has to comply with a generic interface that allows interaction with the various components in Reveal, including lemma storage on the desk;
and finally, it has to allow each different component to store its own metadata, perform its own optimizations on the expressions, and traverse the data structure accordingly.

To achieve that, the implementation was done using a recursive data structure, such that each object represents a word-level expression, which can be a leaf node representing a constant or a variable, or an operation node with an operator and a list of sub-expressions. To scale in space and time, the following techniques are used:

The library avoids frequent OS calls for memory allocation by internally managing memory allocation and resorting to 'bulk allocation', i.e. asking the OS for larger arrays of free memory at a time. Reveal's performance was found to improve up to 20% when this mechanism overrides C++ native 'new' allocation, especially for large benchmarks with millions of allocated nodes.

Hashing functions are used to quickly determine whether two nodes represent the same word-level expression, and potentially eliminate resulting duplicates.

Constant values are automatically propagated through combinational logic and if-then-else expressions, leading to significant simplifications of expressions. Other simplifications include (1) the simplification of trivial multiplexers (e.g. ite(x,a,a); (2) the removal of redundant concatenation/extraction; and (3) the conversion of bit-wise operations (e.g. Verilog's '~' operator for negation) on single-bit variables to Boolean logic operations (Verilog's '!' operator in this case).

In order to be extensible, yet support all of the system functionality, the library supports three main functions:

It allows generic annotation, i.e. storing metadata on each node. Annotation is useful in a number of scenarios. Firstly, it is used to trace a newly created node back to its originating node. For example, assume $n_1$ is a node representing an expression in the transition function of the design, $n_2$ is a node representing the value of $n_1$ in a certain cycle during unrolling, and $n_3$ is a corresponding simplified expression in the violation. In this case, back-annotation allows $n_3$ to point back to $n_2$, which in turn points back to $n_1$. Secondly, annotation is used to flag nodes during various traversal-based analyses done in Reveal. Thirdly, annotation is used to indicate to the solver or MUS extractor the SMT 'modeling' for each node.

It allows recursive traversal of the data structure.

It allows storage on the desk in the form of a native binary format. This format can be used to store the lemma database, as well as the transition relation of the design after parsing.

The Formula Generator module creates equation (3.1) by applying the following steps sequentially:

Preprocessing. Icarus Verilog is used, an open source simulation and synthesis tool for Verilog, to eliminate compiler directives from the design, such as 'include' and 'define' statements.

Flattening and Parsing. To test the correctness of the design, through simulation or formal verification, the design has to be represented in a so-called flat view, such that all modules and functions are instantiated. Flattening in our case generates a new design that is equivalent to the original, and has no instantiation. The new design is parsed into an in-memory annotated tree using Icarus Verilog. The supported design syntax is given in Appendix A, which is a subset of the overall syntax supported by Icarus Verilog.

Calculation of Transition Relation. The Formula Generator takes the Verilog representation and calculates a transition relation for the design variables based on the method described above.

Unrolling. Each Verilog variable in R, W, and M, is assigned a symbolic expression in each cycle based on its transition relation. Rather than using the transition relation as is, the Formula Generator uses the simplifications supplied by the Hardware Relations library to reduce the size of the resulting formula.

The Solver module is responsible for determining the satisfiability or validity of FOL formulas. It interfaces with the YICES SMT solver via a C++API. This module can determine, for example, whether a formula is valid in the EUF or CLU logics, or satisfiable in the bit-vector (BV) logic. This module makes use of the generic annotation mechanism in order to allow the CEGAR Core, as well as the designer, to control the way each expression is modeled in YICES. In particular, each non-leaf expression $e=op(e_1, \ldots, e_n)$ is seen as a combinational component with output e, inputs $e_1, \ldots, e_n$, and function op. In turn, annotation is used to indicate to YICES how to model each component:

The output e can either be represented as a term or a bit-vector. The former modeling is suitable for the EUF and CLU abstractions, while the latter is used during feasibility checking.

The operator op can be modeled in the SMT formulation using a UF/UP node, a CLU node, or a native bit-vector operation supported by YICES.

As alluded to earlier, the CEGAR Core annotates each expression node prior to passing it to the Solver module, which in turn uses this information to formulate the constraints in YICES. The user has also some control over the way expressions are modeled using this mechanism. The latter can be useful for externally controlling Reveal's initial abstraction $\alpha_0(\cdot)$.

The MUS Extractor module is responsible for identifying MUSes from an unsatisfiable formula. The current implementation uses a modified version of the CAMUS MUS extraction algorithm that works directly with the YICES solver. This eliminates the need to generate a propositional encoding of the abstract formula and leads to significant speedup in MUS generation. It also reduces the number of all possible MUSes in the given conjunction, since including (or excluding) constraints in the MUS is now done at a coarser granularity, allowing CAMUS to scale better. It is worth mentioning that given an unsatisfiable formula, CAMUS can be run in three modes: single-, multiple-, or all-MUS extraction, where the last option is used in most of our experiments.

The CEGAR Core component is responsible for coordinating the abstraction, solving, MUS extraction, and refinement processes. It also maintains the persistent lemma database that is accessed across invocations. In each iteration it modifies the lemma database and updates the abstraction for the next iteration. This module is also responsible for integrating user-supplied lemmas into the database.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure. Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

APPENDIX

(a) Verilog description

| | |
|---|---|
| 1. | module design( ); |
| 2. | wire [3:0] a, b; |
| 3. | wire m = a[3]; // msb |
| 4. | wire l = a[0]; // lsb |
| 5. | wire c = m? a >> 1 : a; |
| 6. | wire d = 1? b >> 2 : c; |
| 7. | wire e = m? a : a >> 1; |
| 8. | wire f = l? {2'b00, b[3:2]} : e; |
| 9. | endmodule; |
| 10. | module property( ); |
| 11. | wire p = !(a =0) || (d = f); |
| 12. | endmodule; |

(b) Concrete constraints conc(a, b, c, d, e, f, l, m, p) =
  (m = a[3])∧
  (l = a[0])∧
  (m∧(c = a >> 1) ∨ ¬m∧(c = a))∧
  (l∧(d = b >> 2) ∨ ¬l∧(d = c))∧
  (m∧(e = a) ∨ ¬m∧(e = a >> 1))∧
  (l∧(f = {2'b00, b[3:2]}) ∨ ¬l∧(f = e))∧
  (p = ¬(a = 0) ∨ (d = f))

(c) The mapping for $\alpha^E$ $$\text{conc} \underset{\gamma^E}{\overset{\alpha^E}{\rightleftarrows}} \text{abst}$$

constants

| | |
|---|---|
| 0 | $\hat{0}$ |
| 1 | $\hat{1}$ |
| 2 | $\hat{2}$ | variables

| | |
|---|---|
| a[3:0] | $\hat{a}$ |
| b[3:0] | $\hat{b}$ |
| c[3:0] | $\hat{c}$ |
| d[3:0] | $\hat{d}$ |
| e[3:0] | $\hat{e}$ |
| f[3:0] | $\hat{f}$ |
| l | l |
| m | m |
| p | p | operators

| | |
|---|---|
| x[3] | $EX1(\hat{x})$ |
| x[0] | $EX2(\hat{x})$ |
| x>>y | $SR(\hat{x}, \hat{y})$ |
| x[3:2] | $EX3(\hat{x})$ |
| x, y | $CT(\hat{x}, \hat{y})$ |
| !x | ¬x |

APPENDIX-continued (d) Abstract constraints abst $(\hat{a}, \hat{b}, \hat{c}, \hat{d}, \hat{e}, \hat{f}, l, m, \hat{s}, \hat{t}, \hat{u}, p, \hat{zero}, \hat{one}, \hat{two}) =$
  $(m = EX1(\hat{a})) \wedge$
  $(l = EX2(\hat{a})) \wedge$
  $(\hat{s} = SR1(\hat{a}, \hat{one})) \wedge$
  $(\hat{t} = CT1(\hat{zero}, EX3(\hat{b}))) \wedge$
  $(\hat{u} = SR1(\hat{b}, \hat{two})) \wedge$
  $(\hat{c} = ite(m, \hat{s}, \hat{a})) \wedge$
  $(\hat{d} = ite(l, \hat{u}, \hat{c})) \wedge$
  $(\hat{e} = ite(m, \hat{a}, \hat{s})) \wedge$
  $(\hat{f} = ite(l, \hat{t}, \hat{e})) \wedge$
  $(p = \neg (\hat{a} = \hat{zero}) \vee (\hat{d} = \hat{f}))$.

What is claimed is:

1. A method for verifying a hardware design for an electronic circuit, comprising:
   providing a hardware design description for the electronic circuit;
   extracting a set of design constraints from the hardware design description, where the set of design constraints represents the electronic circuit in terms of signals and logical operations performed on the signals;
   creating an abstraction model from the set of design constraints, where the abstraction model abstracts one or more of the logical operations in the set of design constraints by replacing the abstracted logical operations with uninterpreted functions while the signals in the set of design constraints remain unabstracted in the abstraction model; and
   property checking the abstraction model in relation to one or more design properties, thereby yielding an assignment of variables that represent a violation of the design properties; and
   checking feasibility of the violation in the electronic circuit by conjoining the violation with the set of design constraints to form a conjoined set of constraints, and inputting the conjoined set of constraints into a satisfiability solver, wherein at least the steps of creating an abstraction model and property checking are executed by a computer processor.

2. The method of claim 1 further comprises property checking the abstraction model in relation to one or more design properties using a satisfiability or validity solver, where the solver outputs an assignment of variables that represent a violation of the design properties.

3. The method of claim 2 further comprises property checking the abstraction model using a satisfiability modulo theories solver.

4. The method of claim 1 wherein checking feasibility of a violation further comprises replacing select variable assignments in the assignment with relationships between variables to form a set of constraints that represent the violation, conjoining the set of constraints that represent the violation with the set of design constraints to form a conjoined set of constraints; and inputting the conjoined set of constraints into the satisfiability solver.

5. The method of claim 1 wherein checking feasibility of a violation further comprises using a satisfiability modulo theories solver.

6. The method of claim 2 further comprises refining the abstraction model when the violation is deemed infeasible, and repeating the steps of property checking and feasibility checking with the refined abstraction model.

7. The method of claim 6 further comprises unabstracting select abstracted logical operators in the abstraction model and using the unabstracted logical operators to form the refined abstraction model.

8. The method of claim 6 further comprises creating one or more lemmas from the set of constraints that represent the violation and conjoining the lemmas with the abstraction model for subsequent iterations.

9. The method of claim 8 further comprises creating the lemmas by negating the set of constraints that represent the violation.

10. The method of claim 8 further comprises extracting one or more subset of constraints from the set of constraints that represent the violation and creating the lemmas by negating the subsets of constraints.

11. The method of claim 10 further comprises extracting one, some, or all minimally unsatisfiable subsets of constraints from the set of the constraints that represent the violation, where a minimally unsatisfiable subset is a set of constraints that when conjoined with the design constraints is unsatisfiable but becomes satisfiable if one or more of its constraints is removed from the conjoined set.

12. The method of claim 8 further comprises storing the lemmas in a database for subsequent iterations or verification of the same electronic circuit.

13. A method for verifying a hardware design for an electronic circuit, comprising:
   providing a hardware design description for the electronic circuit;
   extracting a set of design constraints from the hardware design description, where the set of design constraints represents the electronic circuit in terms of signals and logical operations performed on the signals;
   creating an abstraction model from the set of design constraints, where the abstraction model abstracts one or more of the logical operations in the set of constraints with uninterpreted functions;
   property checking the abstraction model in relation to one or more design properties using a satisfiability modulo theories solver, where the satisfiability modulo theories solver outputs an assignment of variables that represent a violation of the design properties;
   replacing select variable assignments with relationships between variables to form a set of constraints that represent the violation;
   conjoining the set of constraints that represent the violation with the set of design constraints to form a conjoined set of constraints; and
   checking feasibility of the violation by inputting the conjoined set of constraints into a satisfiability modulo theories solver, wherein at least the steps of creating an abstraction model, property checking and checking feasibility are executed by a computer processor.

14. The method of claim 13 wherein creating an abstraction model further comprises abstracting one or more signals that are multi-bit while leaving signals that are single bit unabstracted.

15. The method of claim 13 further comprises refining the abstraction model when the violation is infeasible using the set of constraints of the infeasible violation, and repeating the steps of property checking and feasibility checking with the refined abstraction model.

16. The method of claim 15 wherein one or more lemmas are created from the violation, and conjoining the lemmas with the abstraction for subsequent iterations.

17. The method of claim 16 wherein a lemma is created by negating the violation constraints.

18. The method of claim 16 further comprises extracting one or more subsets of constraints from the set of constraints that represent the infeasible violation and using their negation to create refinement lemmas.

19. The method of claim 18 further comprises extracting one, some, or all minimally unsatisfiable subsets of constraints from the set of the violation constraints, where a minimally unsatisfiable subset is a set of constraints that when conjoined with the design constraints is unsatisfiable, but becomes satisfiable if one or more of its constraints is removed from the conjoined set.

20. The method of claim 16 further comprises storing the lemmas in a lemma database for subsequent iterations or verification of the same electronic circuit.

* * * * *